(12) United States Patent
Koyanagi et al.

(10) Patent No.: US 6,370,077 B1
(45) Date of Patent: Apr. 9, 2002

(54) DYNAMIC RANDOM ACCESS MEMORY DEVICE AND SEMICONDUCTOR INTEGRATED CIRCUIT DEVICE

(75) Inventors: Masaru Koyanagi, Yokohama; Kaoru Nakagawa, Kawasaki; Takahiko Hara, Yokohama; Satoru Takase, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/545,438

(22) Filed: Apr. 7, 2000

(30) Foreign Application Priority Data

Apr. 9, 1999 (JP) .............................................. 11-103272
Mar. 10, 2000 (JP) .............................................. 12-066263

(51) Int. Cl.$^7$ ................................................. G11C 8/00
(52) U.S. Cl. .......................... 365/230.03; 365/238.05; 365/196
(58) Field of Search ........................ 365/230.03, 230.05, 365/231, 238.5, 223, 196

(56) References Cited

U.S. PATENT DOCUMENTS 5,410,512 A    4/1995 Takase et al.
5,903,507 A  * 5/1999 Arimoto ........................ 365/222
6,031,779 A  * 2/2000 Takahashi et al. ............ 365/226
6,088,291 A  * 7/2000 Fujioka et al. ................ 365/233
6,154,821 A  * 11/2000 Barth et al. .................. 711/170

OTHER PUBLICATIONS

Rambus Direct RDRAM 256/288 Mbit (512K×16/18×32s) Datasheet pp.1–62.
Takase et al., "A 1.6GB/s DRAM with Flexible Mapping Redundancy Technique and Additional Refresh Scheme", 1999 IEEE International Solid–State Circuits Conference,.

* cited by examiner

Primary Examiner—David Nelms
Assistant Examiner—Thong Le
(74) Attorney, Agent, or Firm—Banner & Witcoff, Ltd.

(57) ABSTRACT

A DRAM, including a plurality of banks each having a plurality of sub-arrays, and sense amplifier circuits commonly shared by sub-arrays in different banks, has a row access mode for activating a sub-array selected from each bank for reading or writing data, and a refresh mode for activating a plurality of sub-arrays in each bank and refreshing memory cell data therein at substantially the same timing. Sub-arrays in each bank activated at substantially the same timing in the refresh mode are more than sub-arrays in each bank activated in the row access model. Thereby, occurrence of operation constrains is minimized to ensure high-speed operation and improve the system performance of DRAMs employing the non-independent bank system.

47 Claims, 34 Drawing Sheets

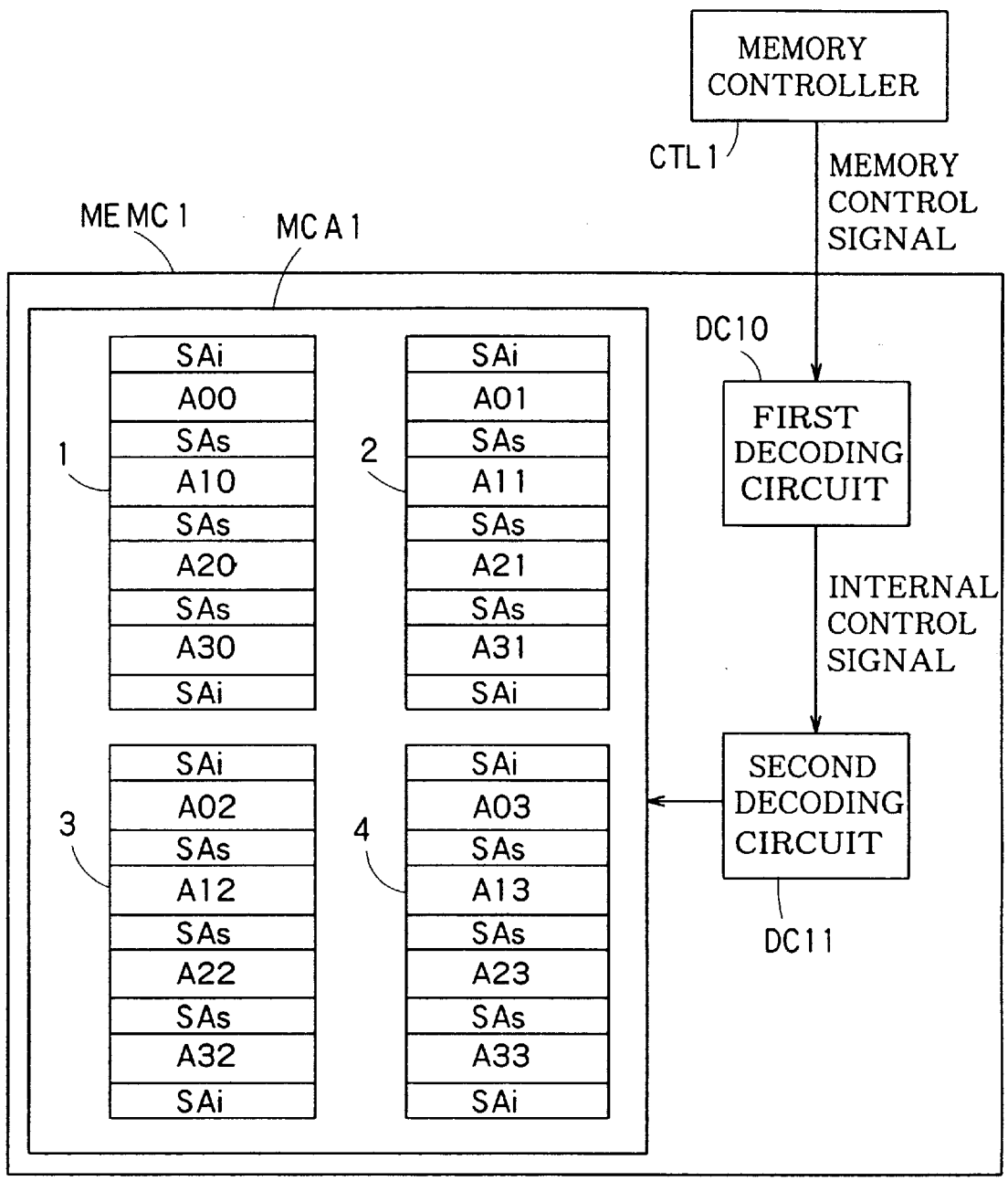
F I G. 1

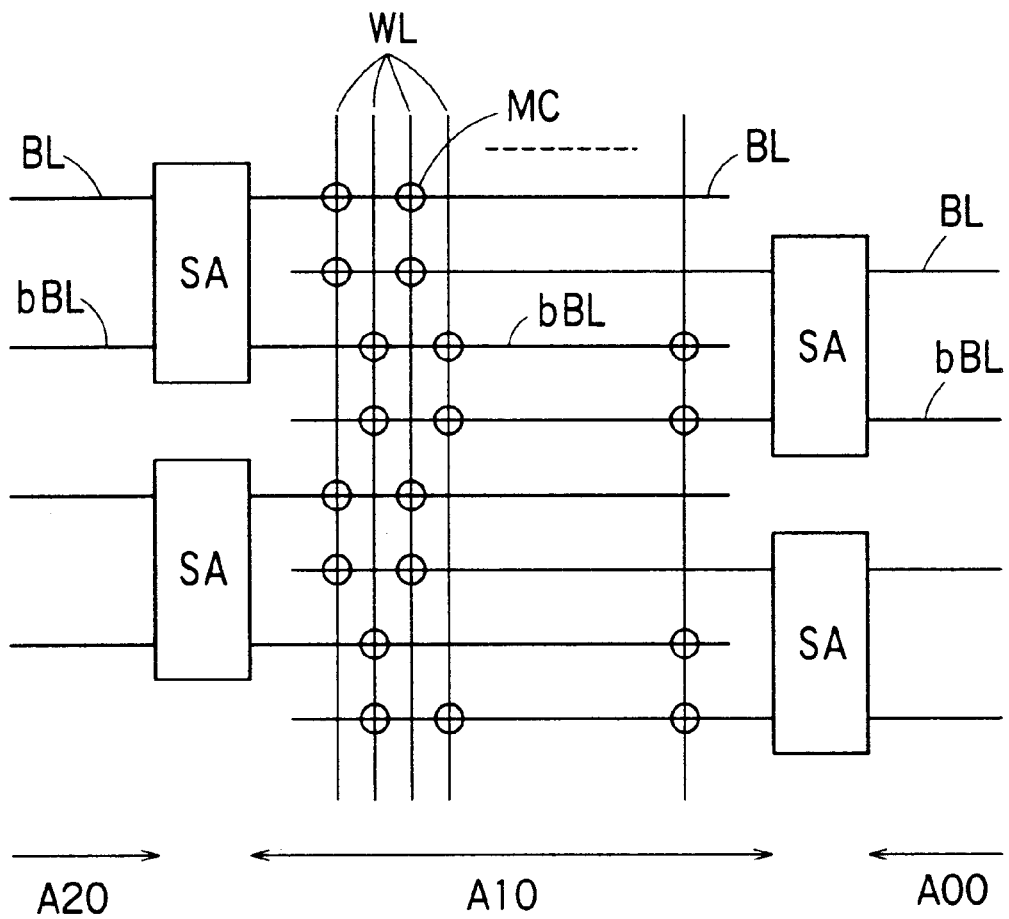
F I G. 2

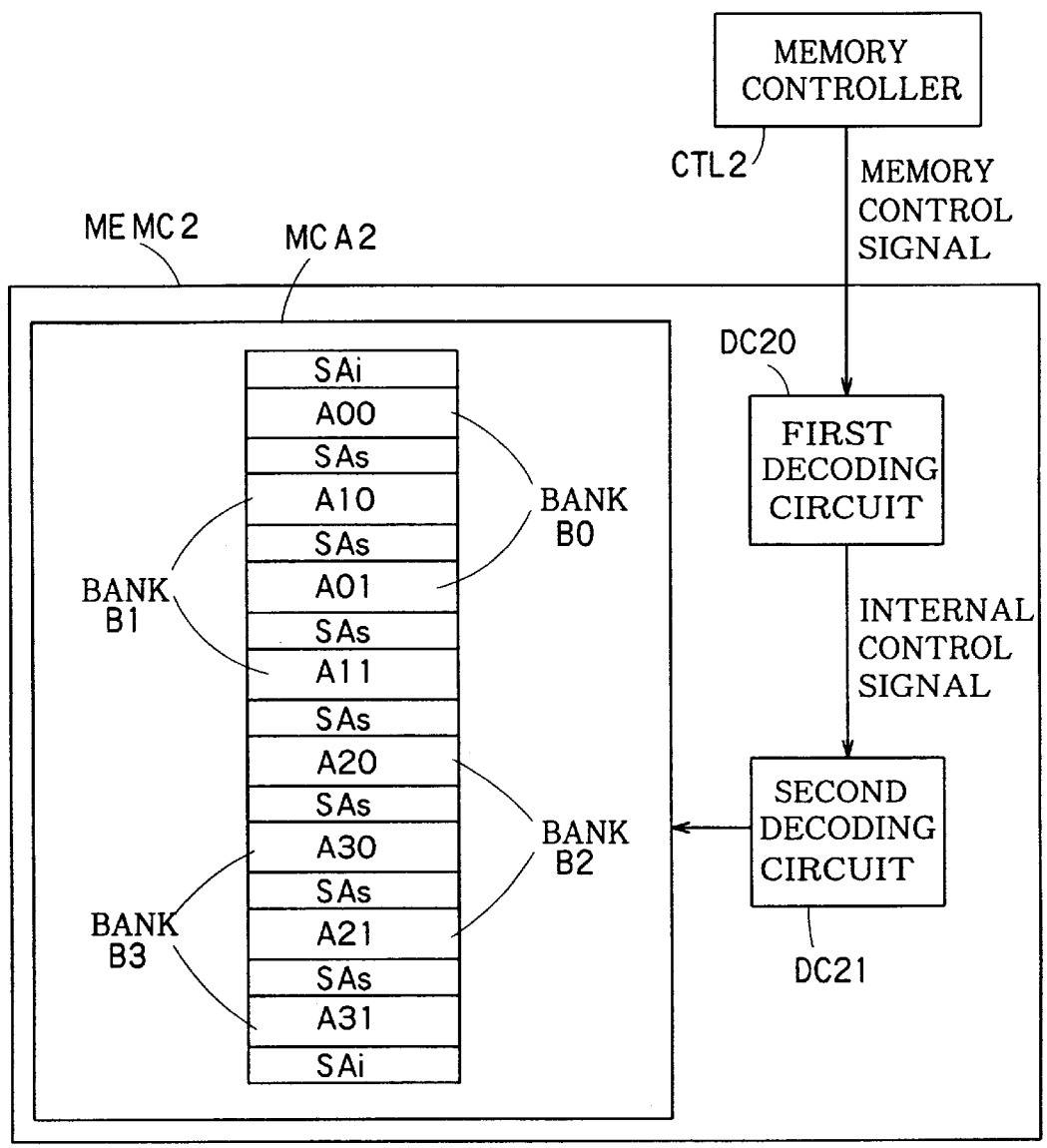
F I G. 6A

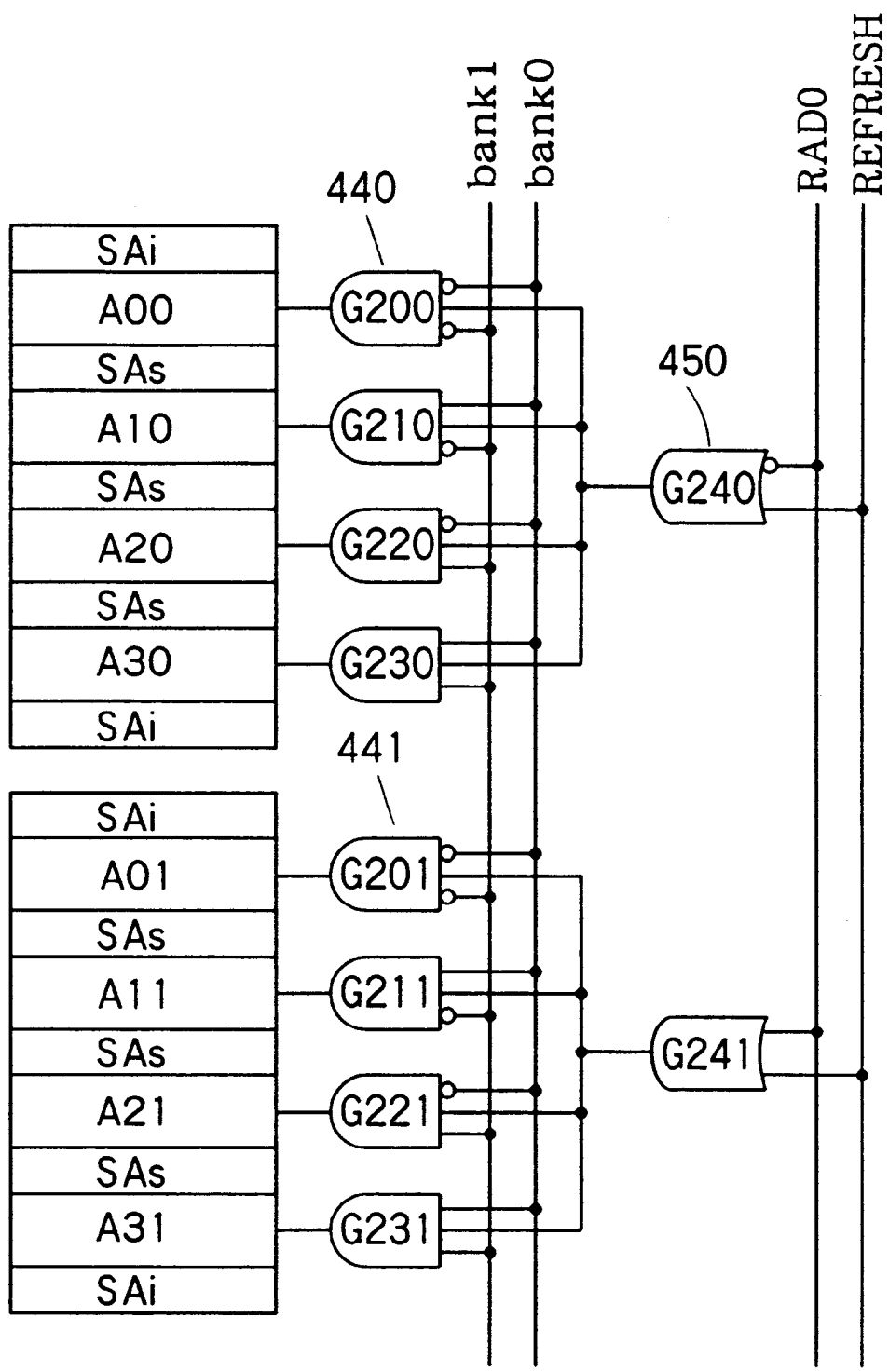
F I G. 7B

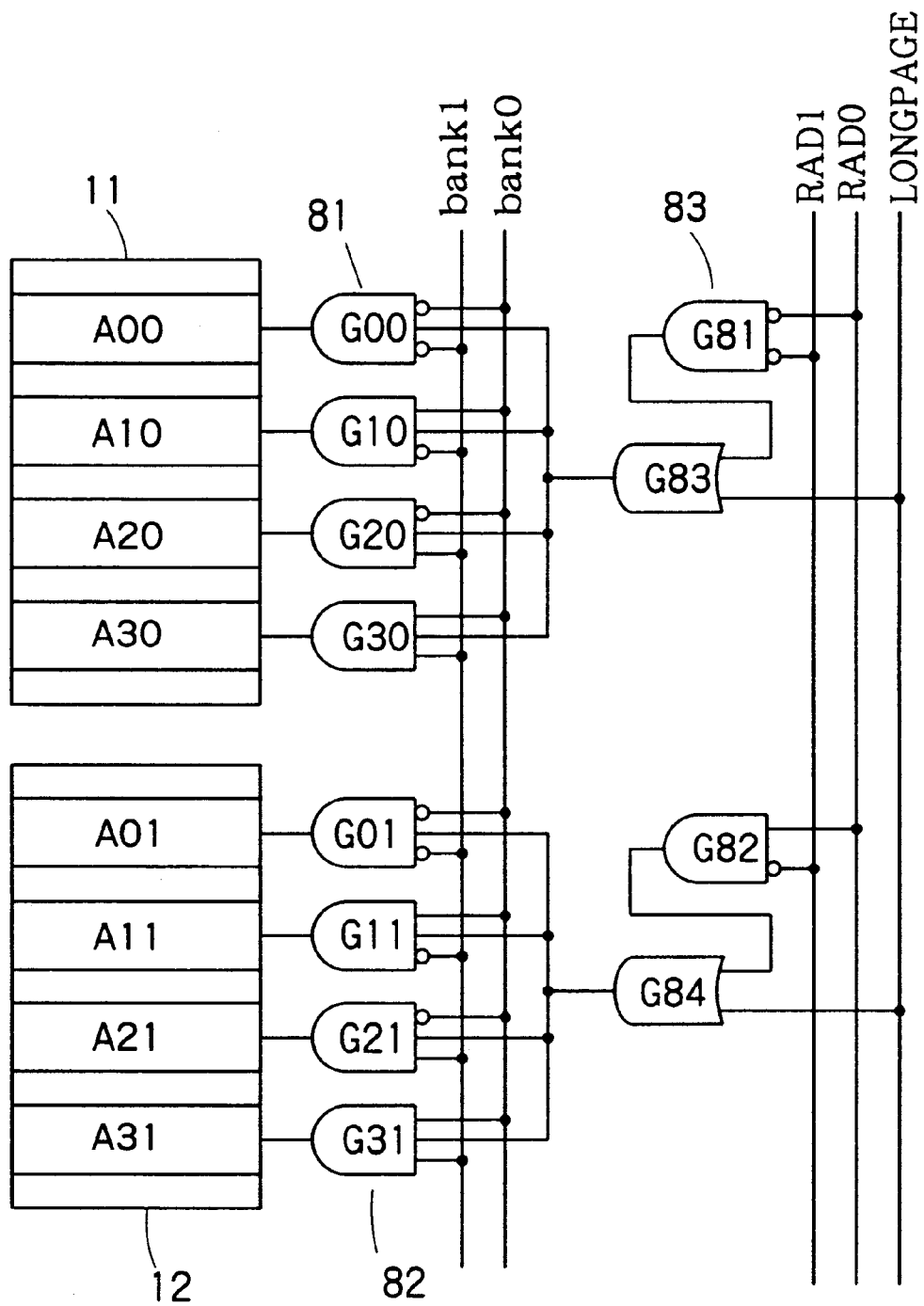
F I G. 9

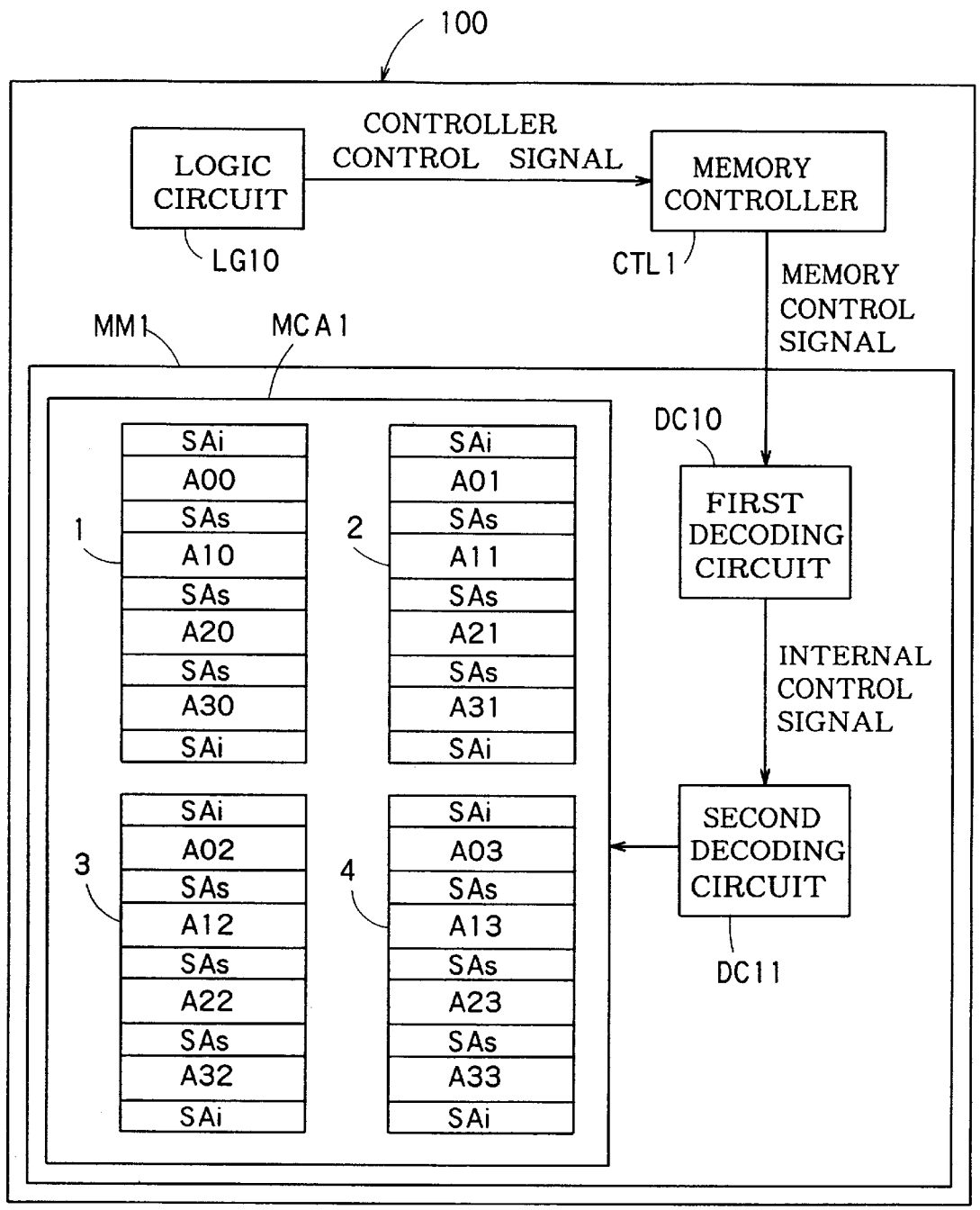
F I G. 12

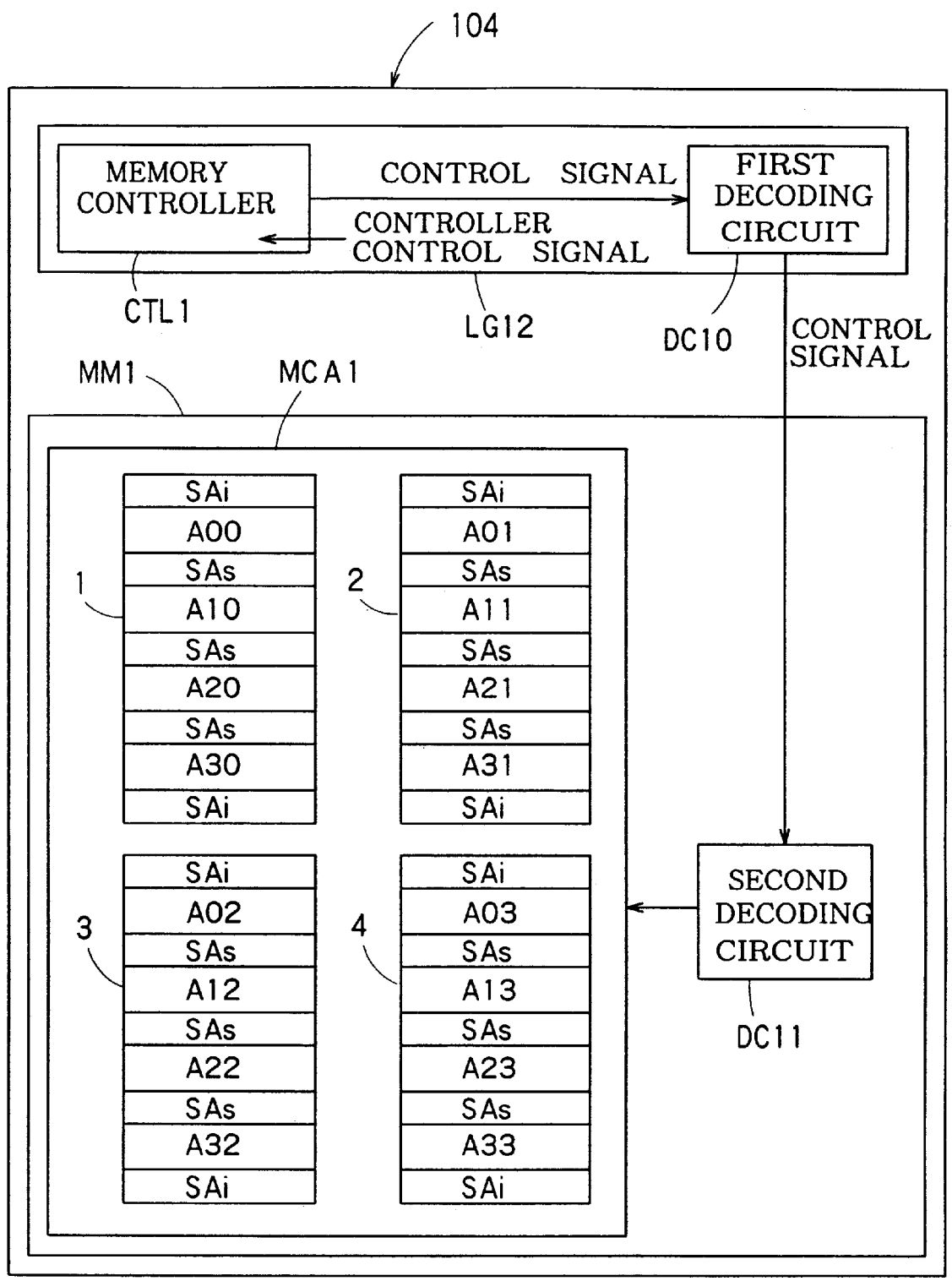
F I G. 14

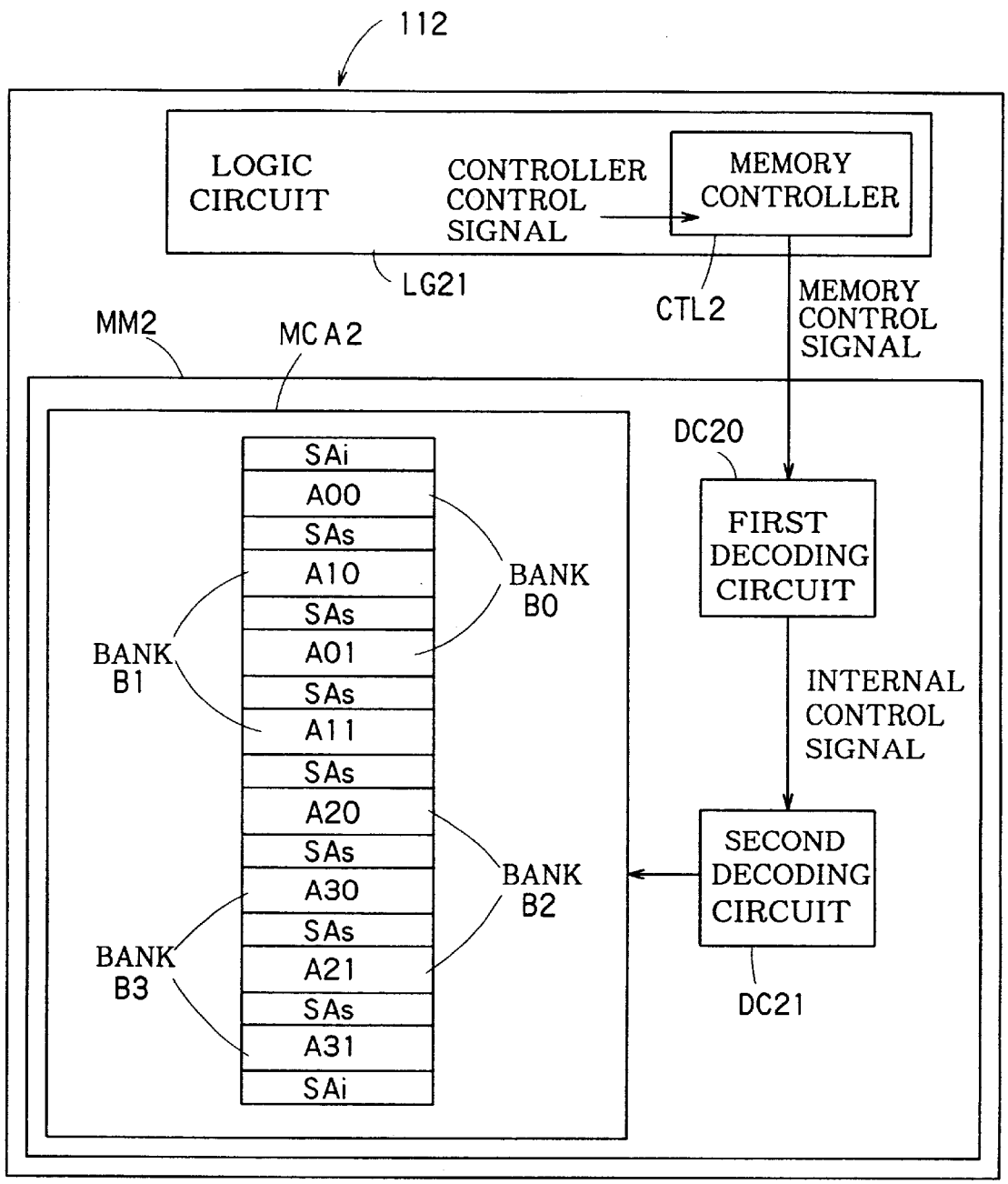
F I G. 17

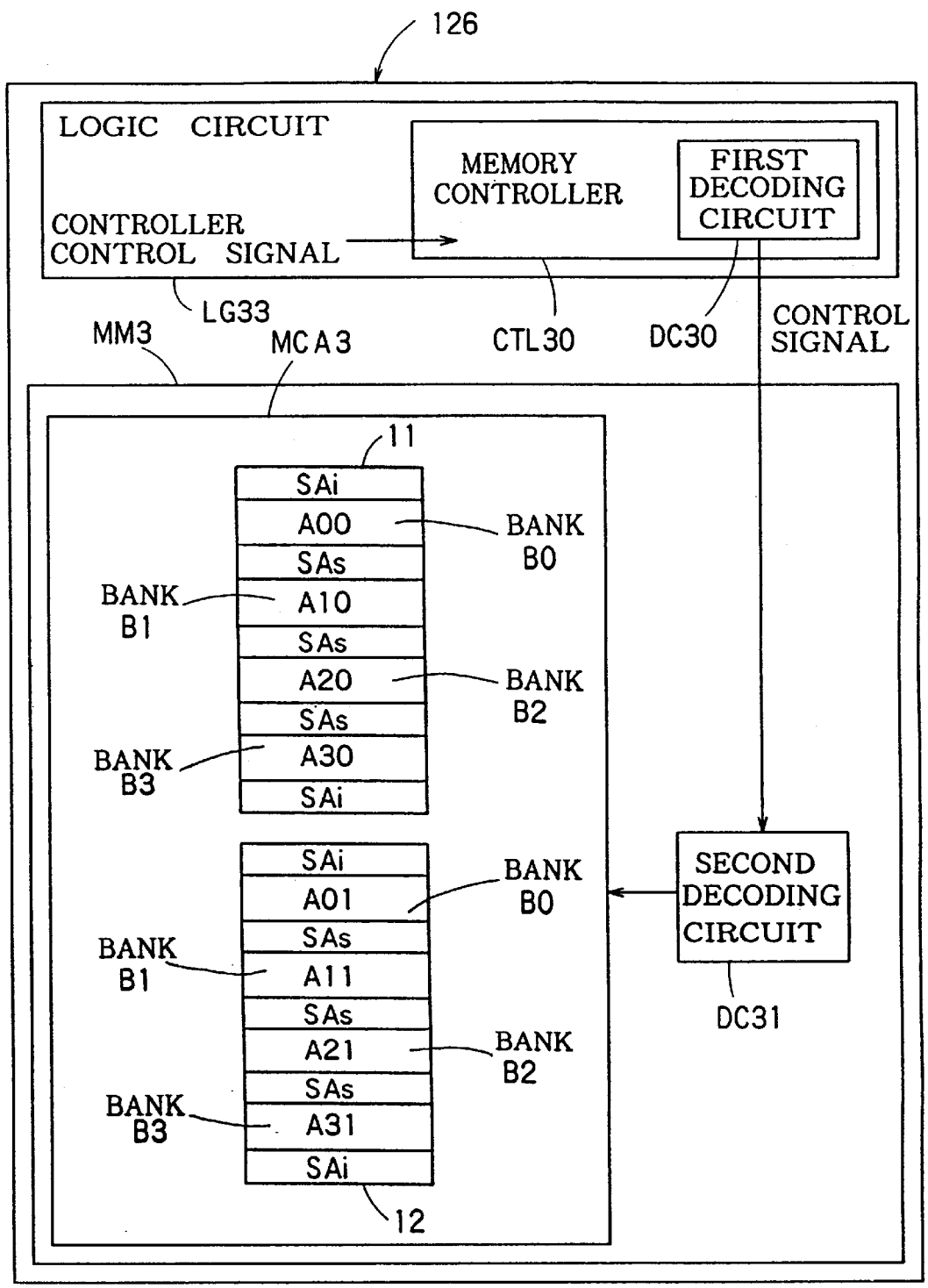
F I G. 23

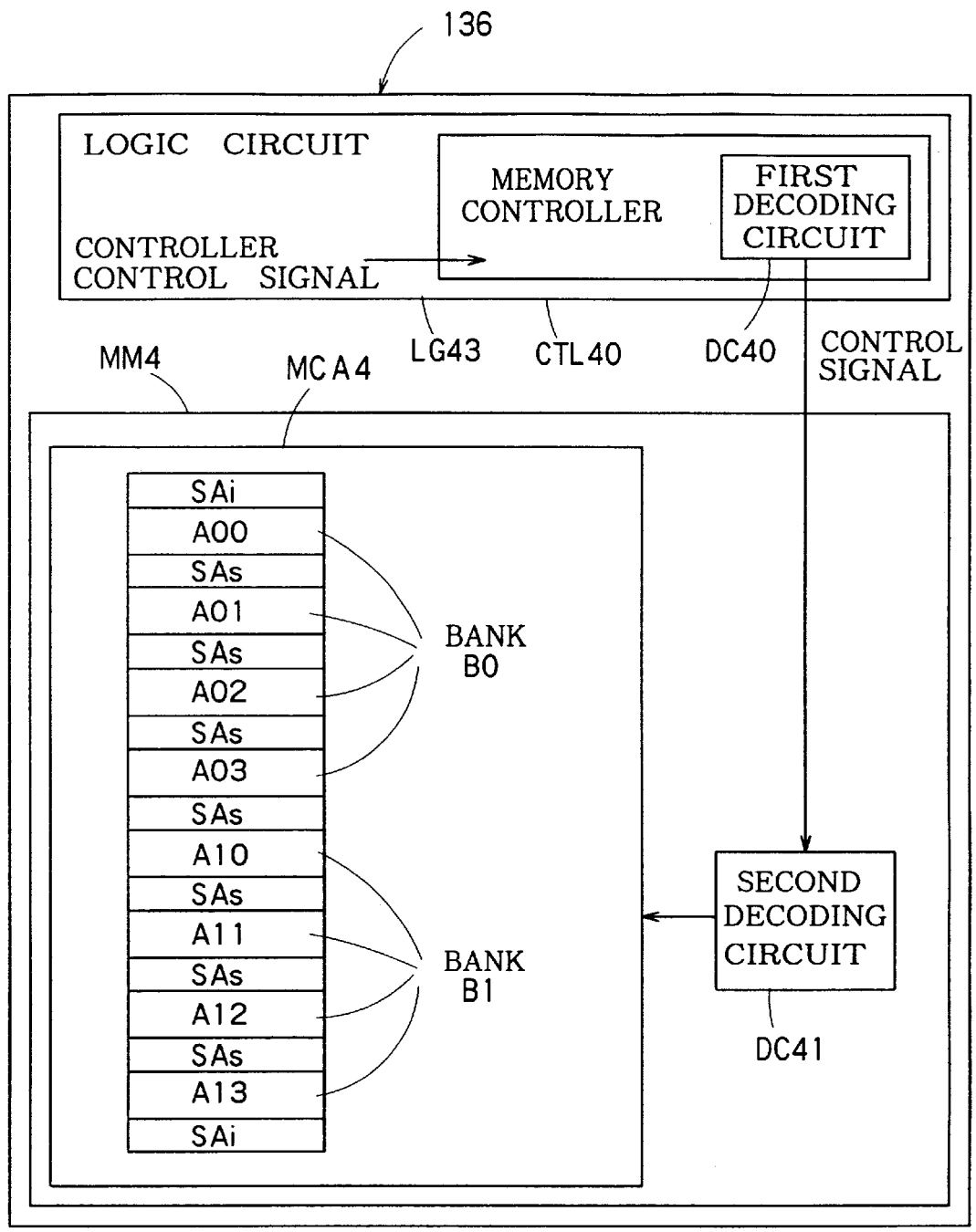
F I G. 27

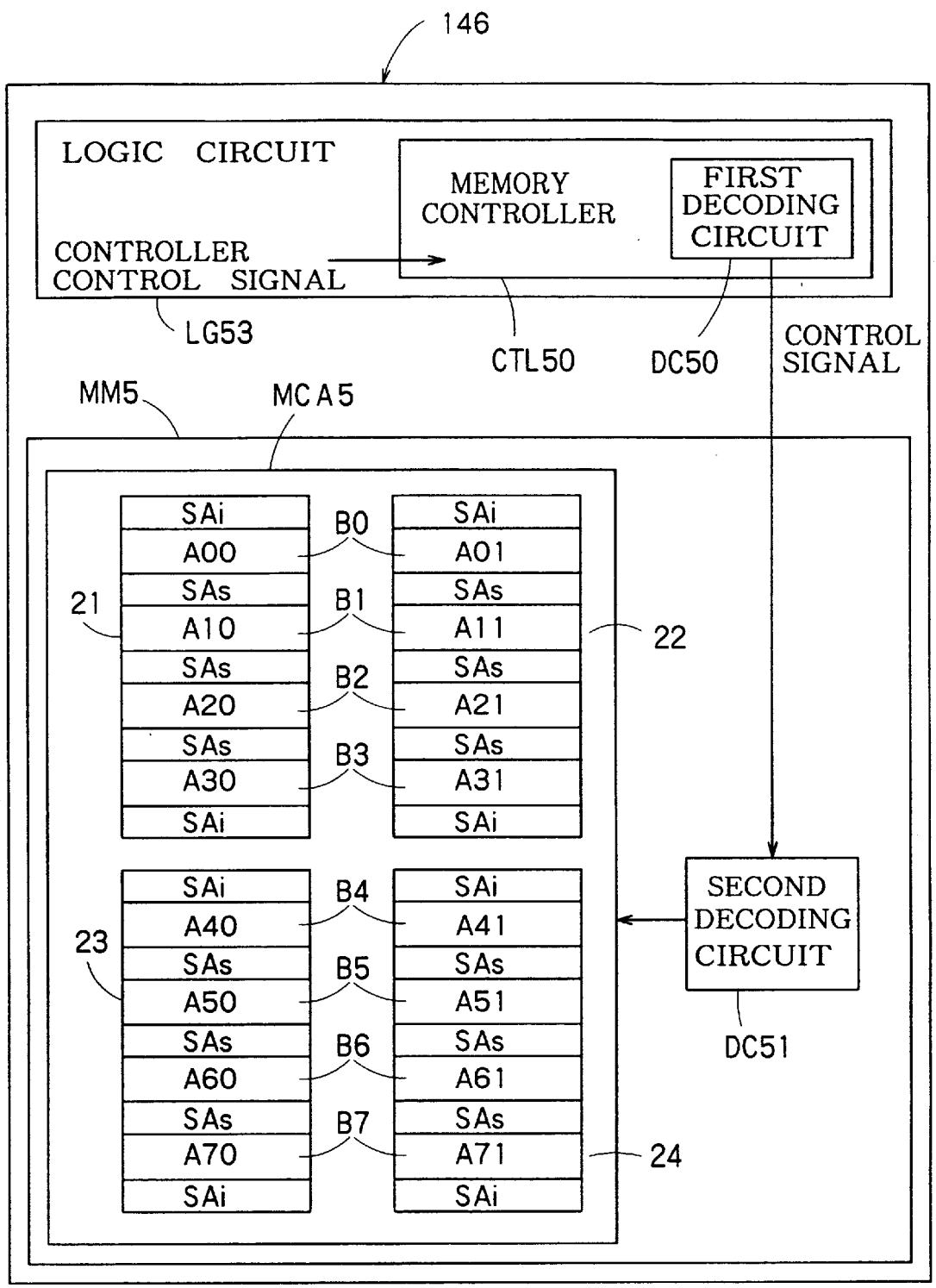
F I G. 31

DYNAMIC RANDOM ACCESS MEMORY DEVICE AND SEMICONDUCTOR INTEGRATED CIRCUIT DEVICE

RELATED APPLICATION

This application claims benefit of priority under 35 U.S.C. §119 to Japanese Patent Applications No. H11-103272, filed on Apr. 9, 1999, and No. 2000-66263, filed on Mar. 10, 2000, the entire contents of which are incorporated by reference herein.

BACKGROUND OF THE INVENTION

1. Field of the Invention

This invention relates to a dynamic random access memory (DRAM) device and a semiconductor integrated circuit device, and more particularly to an improvement of the refresh operations.

2. Description of the Relates Background Art

For DRAMs, refreshment of memory cell data is indispensable, and it is necessary to refresh data of all memory cells within a predetermined length of time. If refreshment is not effected properly, reading of data will be disabled due to leakage of charges from memory cells.

The time required for refreshment is getting longer and longer as the DRAM capacity increases, and particular consideration has been required about influences of the longer time for refreshment to the performance of DRAM systems. More specifically, although refresh operation of typical DRAM is controlled by a memory controller, or the like, the time spent by the memory controller for issuance of refresh requests increase, and it oppresses the time for the ordinary operation.

As an solution of this problem, there is a method of refreshing a plurality of sub-arrays simultaneously with a single refresh command from the memory controller. With this method, refresh commands from the memory controller can be reduced, and the load to the memory controller can be alleviated. This is a technique that has been employed for years.

On the other hand, for the purpose of improving the performance of a large-capacity DRAM system, a "multi-bank system" has come to be employed recently. With this system, access time can be reduced substantially by calling interleave operation, which makes an access time and another partly overlap when a plurality of banks are accessed to.

In recent DRAMs, a "shared sense-amplifier system" in which adjacent sub-arrays share a sense-amplifier in order to improve the efficiency per unit area. This system can reduce the area of the sense-amplifier circuit region close to ½ of those of systems other than the shared sense-amplifier system.

There has been also proposed a "non-independent bank system" simultaneously employing the "multi-bank system" and the "shared sense-amplifier system" (See "A 1.6 Gigabytes DRAM-with Flexible Mapping Redundancy Technique and Additional Refresh Scheme", 1999 ISSC digest of technical papers, pp. 410 (ISSN 0193-6530). In this system, adjacent banks are not independent from each other, and share a common sense-amplifier circuit. Thus, advantages of both the multi-bank system and the shared sense-amplifier system can be retained altogether.

However, in case of the non-independent bank system, there is a constraint as a result of using the shared sense-amplifier system, and it is not possible to simultaneously activate two banks sharing a sense-amplifier circuit. Although a shared sense-amplifier circuit can be commonly used by two sub-arrays, while it is used by one of the sub-arrays, it has be disconnected from the other sub-array. This constraint on operation also applies to refresh operation. Also upon activation for refresh operation, in case of sub-arrays sharing a common sense amplifier circuit, unless one of them is set in a precharged state, the other cannot be activated.

The constraint on operation discussed above adversely affects the performance of the DRAM system. For example, when it is desired to start refresh operation of a particular sub-array, if an adjacent sub-array commonly sharing a sense amplifier circuit with the particular sub-array is currently activated, the system has to wait until the adjacent sub-array is set in the precharged state. Further, during ordinary operation, when data of a particular sub-array should be accessed to, in the case where the system is configured to preferentially effectuate refresh operation when a refresh request comes to the adjacent sub-array sharing the common sense amplifier circuit, it is necessary to one precharge the particular sub-array, wait that the adjacent sub-array completes its refresh operation and precharges, and thereafter active the particular sub-array.

SUMMARY OF THE INVENTION

It is therefore an object of the invention to provide a DRAM of a non-independent bank system which enables high-speed operation by reducing the occurrence probability of operation constraint and improves the system performance. It is also an object of the invention to provide a semiconductor integrated circuit device incorporating such DRAM and a logic circuit.

The present invention is characterized in a dynamic random access memory device having a plurality of banks each including a plurality of sub-arrays, and a sense amplifier circuit commonly shared by sub-arrays in different banks, which has a row access mode for activating a sub-array selected from each said bank for reading or writing data, and a refresh mode for activating a plurality of sub-arrays in each said bank at substantially the same timing to refresh the memory cell data therein, the number of sub-arrays in a single bank activated at substantially the same timing in said refresh mode being larger than the number of sub-arrays in a single bank activated in said row access mode. Activating a plurality of sub-arrays at substantially the same timing means activating a plurality of sub-arrays in response to a single command from a memory controller. Therefore, in response to a single command from the memory controller, the plurality of sub-arrays may be activated with a time difference inside the memory.

According to the invention, by activating a larger number of sub-arrays in a single bank at the same time in the refresh mode, the load to the memory controller can be alleviated, and this contributes to an improvement of the performance of the DRAM system. Further, by activating a larger number of sub-arrays in a single bank at substantially the same timing, the number of banks activated at substantially the same timing can be reduced, and this contributes to decreasing the occurrence of operation constraints peculiar to non-independent bank structures employing a shared sense-amplifier system. As a result, useless precharge period is no longer required, and a high effective data transfer rate and high operation are ensured.

More specifically, in the present invention, it is possible to design the device so that, within each bank, a plurality of sub-arrays do not commonly share a sense amplifier, and all sub-arrays in one bank are activated at substantially the same timing in the refresh mode. In this manner, operation constraints are minimized.

In the present invention, the device may be designed to provide a plurality of independent blocks each including a plurality of sub-arrays so that, in each block, a plurality of adjacent sub-arrays share a sense amplifier circuit, and a plurality of sub-arrays selected from each block constitute a single bank.

In this case, for a decoding circuit for selecting a single sub-array from a single bank in the row access mode in response to a bank address and a block designating address (for example, most significant bit of a row address), a refresh control circuit may be provided, which restricts the block selecting function in the refresh mode in response to the refresh signal to activate a plurality of sub-arrays in a single bank at substantially the same timing.

In the case where there is provided, in addition to the decoding circuit, a page length variable signal line for restricting the block selecting function of the decoding circuit and activating a plurality of sub-arrays in a single bank at the same time, the page length variable signal line can be used as a refresh control line for restricting the block selecting function of the decoding circuit in the refresh mode and activating a plurality of sub-arrays in a single bank at substantially the same timing.

Furthermore, in the present invention, in the case where a plurality of sub-arrays are arranged to share a sense amplifier circuit between adjacent ones, addresses can be set so that every other sub-arrays are designated as one bank in the order of arrangement, and one end of the arrangement is the least significant bank address while the other end of the arrangement is the most significant bank address.

BRIEF DESCRIPTION OF THE DRAWINGS

FIG. 1 is a diagram showing configuration of a dynamic random access memory device according to the first embodiment of the invention;

FIG. 2 is a diagram showing configuration of a cell array in the same embodiment;

FIG. 6A is a diagram showing configuration of a dynamic random access memory device according to the third embodiment of the invention;

FIG. 7B is diagram showing configuration of a second decoding circuit in the same embodiment;

FIG. 9 is a diagram showing a modified version of the second decoding circuit in the fourth embodiment of the invention;

FIG. 12 is a diagram showing inside configuration of a semiconductor integrated circuit device in the eighth embodiment (when a logic circuit and a memory controller are formed separately);

FIG. 14 is a diagram showing inside configuration of the semiconductor integrating circuit device in the eighth embodiment (when the memory controller and a first decoding circuit are formed inside the logic circuit);

FIG. 17 is a diagram showing inside configuration of the semiconductor integrating circuit device in the ninth embodiment (when the memory controller is formed inside the logic circuit);

FIG. 23 is a diagram showing inside configuration of the semiconductor integrating circuit device in the tenth embodiment (when the memory controller is formed inside the logic circuit, and the first decoding circuit is provided inside the memory controller);

FIG. 27 is a diagram showing inside configuration of the semiconductor integrating circuit device in the eleventh embodiment (when the memory controller is formed inside the logic circuit, and the first decoding circuit is provided inside the memory controller);

FIG. 31 is a diagram showing inside configuration of the semiconductor integrating circuit device in the twelfth embodiment (when the memory controller is formed inside the logic circuit, and the first decoding circuit is provided inside the memory controller).

DETAILED DESCRIPTION OF THE PREFERRED EMBODIMENTS

Figure 3:
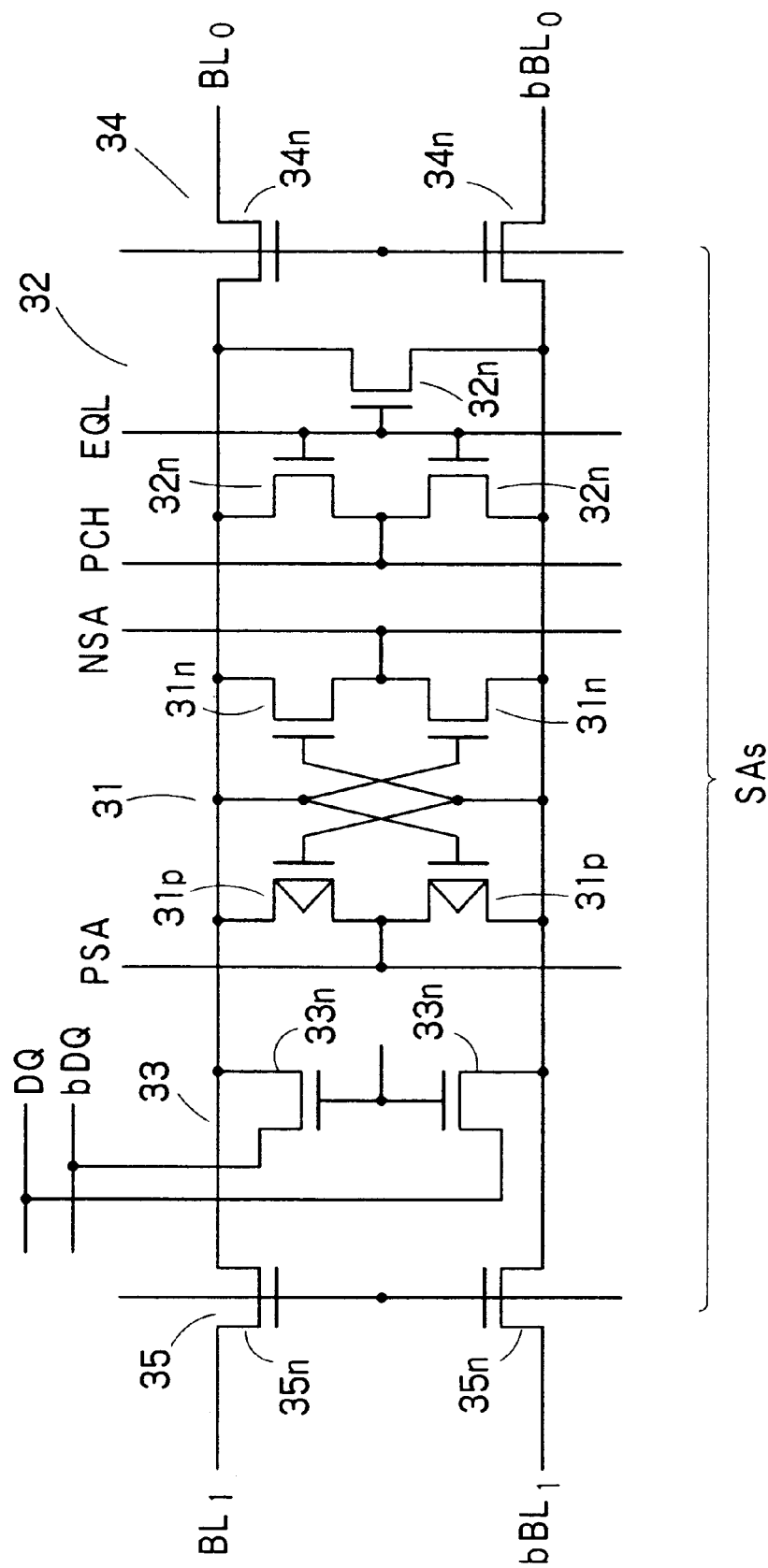
FIG. 3 is a diagram showing configuration of a sense amplifier circuit in the same embodiment.

Explained below are embodiments of the invention with reference to the drawings.

FIRST EMBODIMENT

FIG. 1 shows configuration of a memory cell array of according to the first embodiment. This embodiment is an example of a four-bank structure in which 16 sub-arrays form four banks each including four sub-arrays. More specifically, every four sub-arrays (A00, A10, A20, A30), (A01, A11, A21, A31), (A02, A12, A22, A32), and (A03, A13, A23, A33) share sense amplifiers SAs between every two adjacent sub-arrays, and make up the blocks 1, 2, 3 and 4. Each of the blocks 1 to 4 has, at opposite ends thereof, independent sense amplifier circuits SAi not shared with other sub-arrays.

In this and other embodiments, a sense amplifier circuit shared by adjacent sub-arrays is labeled as "SAs" whereas a sense amplifier circuit not shared by other sub-arrays is labeled as "SAi".

The first sub-arrays A00, A01, A02 and A03 in individual blocks 1 to 4 make up a single bank B0. Similarly, the second sub-arrays A10, A11, A12 and A13 make up another bank B1, the third sub-arrays A20, A21, A22 and A23 make up still another bank B2, and the fourth sub-arrays A30, A31, A32 and A33 make up the remainder bank B3. Therefore, in case of this embodiment, within each bank, four sub-arrays does not share sense amplifier circuits, but sub-arrays from individual banks share the sense amplifier circuits. For example, sub-arrays A00, A01, A02 and A03 do not share the sense amplifiers SAs or SAi. However, among different banks B0 and B1, sub-arrays A00 and A10 share the sense amplifier SAs.

In this specification, the term "sub-array" pertains to a certain range of the memory cell array in which a plurality of bit lines and word lines are arranged to intersect and memory cells are located at their crossing points. The "bank" pertains to a range of sub-arrays designated by a bank address. The bank address is usually added as "bank" commonly at the most significant bits of a row address for selection of a word line and a column address for selection of a bit line. In a system with four banks, a bank address is defined by two bits, bank0 and bank1. These four banks, B0, B1, B2 and B3, are controlled by a memory controller CTL1 via a first decoding circuit DC10 and a second decoding circuit DC11.

That is, the memory controller CTL1 sends a memory control signal to a memory chip MEMC1. The memory control signal contains all signals required for controlling the memory chip MEMC1. The memory control signal is input the first decoding circuit DC10 of the memory chip MEMC1.

The first decoding circuit DC10 selects a necessary signal from the memory control signal then introduced, latches it for a required time, and outputs it as an internal control signal. Although explained later, the internal control signal includes bank address bank0, bank1, row address RAD0, RAD1, refresh control signal REFRESH, and so on. The internal control is input to a second decoding circuit DC11. The first decoding circuit DC10 may be a latch circuit merely functioning to latch the memory control signal for a required time.

The second decoding circuit DC11 decodes the internal control signal, and based on the internal control signal, controls the memory cell array MCA1.

FIG. 2 shows configuration of an equivalent circuit of the block 1 of FIG. 1, taking the sub-array A10 as an example. As shown here, in the sub-array A10, a plurality of word lines WL and plural pairs of bit lines BL and bBL are arranged, and memory cells MC are placed at their crossing points. At opposite ends of the sub-array A10, sense amplifier circuits SA shared with adjacent sub-arrays A00 and A20 are provided.

FIG. 3 shows a concrete configuration of the shared sense amplifier circuit SAs. The body of the sense amplifier circuit SAs is P-type MOS transistors 31p, 31p, N-type MOS sense amplifiers 31n, 31n, and bit line sense amplifiers 31. In addition to the bit line sense amplifier 31, there is provided an equalizer circuit controlled by an equalize signal EQL to initialize the pair of bit lines BL, bBL to a precharge potential PCH. The equalizer circuit 32 includes N-type MOS transistors 32n, 32n, 32n. Additionally, nodes of the sense amplifier are selectively connected to the pair of data lines DQ, bDQ. The column selecting gate 33 is selectively connected to the bit line pair BL0, bBL0 and the bit line pair BL1, bBL1 of two sub-arrays sharing the sense amplifier circuit SAs by switching action of the transfer gates 34, 35. The transfer gate 34 includes N-type MOS transistors 34n, 34n whereas the transfer gate 35 includes N-type MOS transistors 35n, 35n.

The embodiment shown here employs a non-independent bank system combining the multi-bank system and the shared sense amplifier system as already explained. Therefore, when a plurality of banks are accessed to, there are certain operation constrains accompanying the shared sense-amplifier system. However, the row access speed can be increased by interleave operation among banks. Further, the area of the memory cell array can be decreased more than the independent bank system.

For example, in FIG. 1, in an ordinary row access mode, sub-arrays A20, A22, A23 among sub-arrays in the bank B2 are in the precharged status, and then the sub-array A21 is activated. That is, the word line of the sub-array A21 is activate, memory cell data is transferred to the bit line, and the sense amplifier circuit detects, amplifies and takes it out. In this manner, if a bank includes a plurality of sub-arrays, limiting the number of activated sub-arrays to a required page length is effective because the operation current of the row system can be suppressed.

Figure 4:
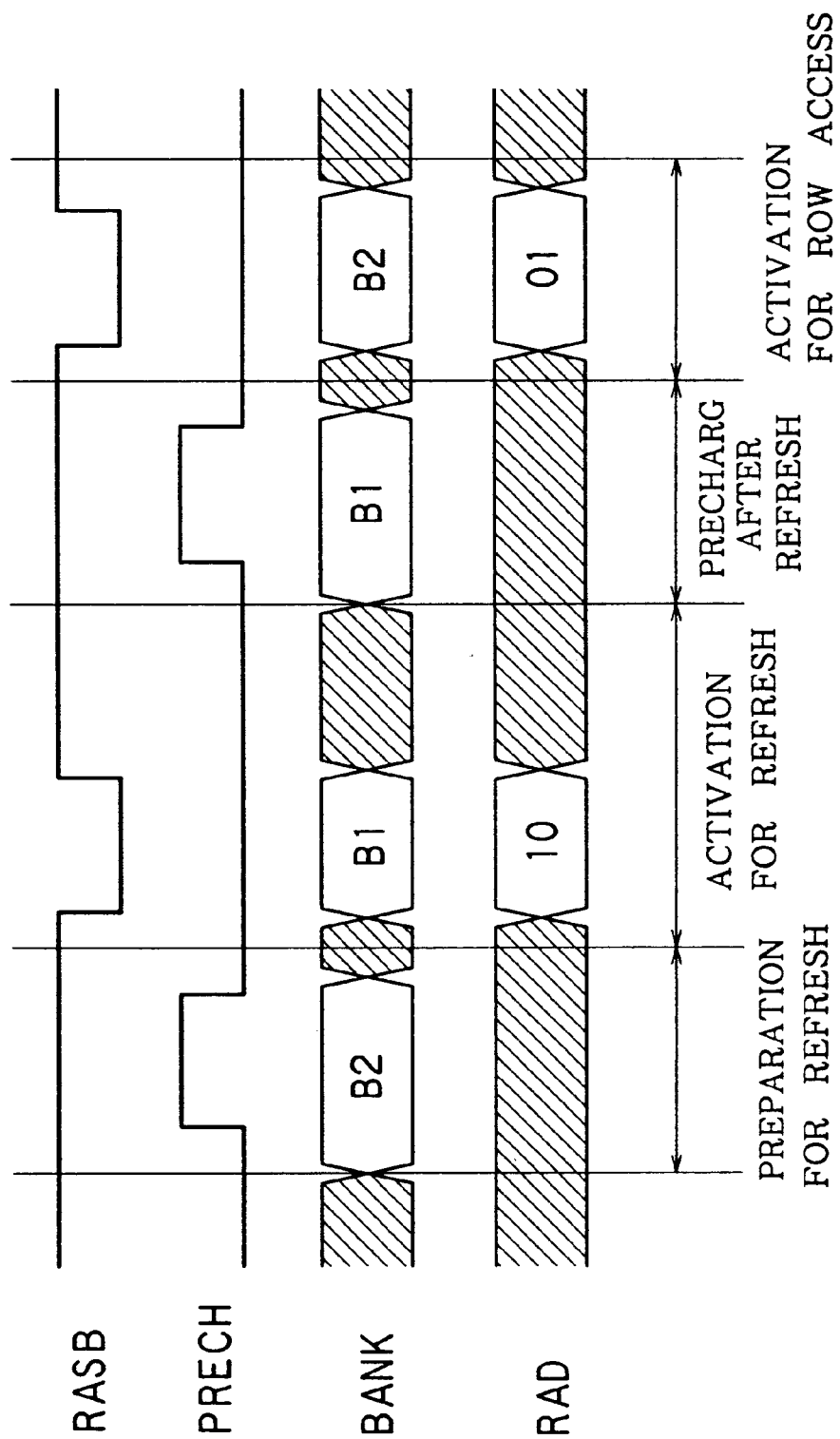
FIG. 4 is a timing chart for explaining refresh operation in the same embodiment.

Next explained is the relation between the refresh operation, this embodiment is directed to, and normal row access operation with reference to the timing chart of FIG. 4.

In FIG. 1, under the status where the sub-array A21 of the bank B2 is currently activated, assume that a refresh request is issued to the sub-array A13 of the bank B1. Since the banks B1 and B2 are non-independent banks sharing a common sense amplifier circuit, it is necessary to precharge the sub-array belonging to the bank B2 before the sub-array in the bank B1 is activated. This is the period of "preparation for refresh" shown in FIG. 4, the bank B2 heretofore activated is precharged by the precharge signal PRECH= "H". This precharge is executed for all sub-arrays in the bank B2 simultaneously.

After that, the row-system activating signal RASB becomes "L", the bank B1 is selected, and the sub-array A13, which is the target of the current refresh request, is activated for refreshment. In FIG. 4, the row address RAD is two-bit data indicating which of four blocks 1 through 4 in FIG. 1 has been selected, and RAD="10" shown there indicates that the block 4 among four blocks, hence the sub-array A13 in the bank B1, has been selected. The row address RAD is made up of part of bits of a row address for selection of a word line.

After the activation of refresh, the precharge signal PRECH again becomes "H", and precharge is carried out after the refresh in the Bank 1. The sum of the period of "activation for refresh" and the period of the "precharge after refresh" is the total refresh period.

If here is an access request to another sub-array from a normal application, "activation for row access" for the sub-array is required. In the example shown in FIG. 4, after the "precharge after refresh", the row-system activating signal RASB becomes "L", and the sub-arrays of the bank B2 are activated.

In case of the independent bank system, refreshment and normal row access can be effected without waiting for the period of "preparation for refresh" and "precharge after refresh" shown in FIG. 4. That is, this embodiment employing the non-independent bank system takes so much additional time. However, it is only for access to adjacent banks sharing a sense amplifier circuit that such additional time is required. Therefore, involving the refresh operation, if the number of banks activated simultaneously decreases, the probability of requiring additional time becomes low.

In the embodiment shown here, which employs the non-independent bank system, since sub-arrays in a single bank do not share sense amplifier circuits, two or more of them can be activated concurrently. Taking it into account, the device is preferably designed so that sub-arrays activated in each bank are more than sub-arrays simultaneously activated in the normal row access mode. This means that less banks are activated upon refreshment. In this manner, it is possible to alleviate the load to the memory controller CTL1, suppress the occurrence of operation constraints caused by the use of the shared sense-amplifier system, and increase the operation speed.

Explanation is made more specifically about the case shown in FIG. 1. Under the issuance of a request for simultaneous activation of a plurality sub-arrays only upon refreshment, two sub-arrays A00 and A01, three sub-arrays A00, A01 and A02, or all sub-arrays A00 to A03 belonging to the bank B0, for example, are simultaneously activated. As already explained, since these sub-arrays do not share sense amplifier circuits among them, they can be activated simultaneously. And, since these sub-arrays all belong to the common bank B0, in the bank B2, and B3 not sharing sense amplifier circuits with them, activation is possible irrespectively of the current status of the bank B0.

In this manner, when more sub-arrays are simultaneously activated upon refreshment than normal row access, the influence to the system performance varies with the number of banks activated simultaneously. Limiting the number of simultaneously activated banks as few as possible makes the system performance higher, and hence makes it effective to simultaneously activate many sub-arrays belonging to a common bank as explained above. Especially, it is effective to simultaneously refresh all sub-arrays in a single bank upon a refresh request.

That is, the control circuit in the DRAM according to the invention, which includes the memory controller CTL1, first decoding circuit DC10, and second decoding circuit DC11, has a row access mode and a refresh mode. In the row access mode, the sub-array A21 in the bank B2, for example, selected for reading or writing data, is activated. In the refresh mode, a plurality of sub-arrays A10, A11, A12, A13 in the bank B1, for example, are simultaneously activated to refresh the memory cell data. Therefore, the number of sub-arrays simultaneously activated in one bank in the refresh mode is more than the number of sub-arrays activated in one bank in the row access mode. As a result, the frequency of issuance of refresh requests in the memory controller CTL1 is reduced, and the load to the memory controller CTL1 is alleviated. Additionally, since a plurality of sub-arrays belonging to a single bank are refreshed simultaneously, here is reduced the probability of requirement for simultaneously activating adjacent sub-arrays sharing a common sense amplifier SAs, conflicting with normal row access, etc. Therefore, it is possible to minimize the probability of being compelled to wait for the time of "precharge after refresh" and the time of "activation for row access" shown in FIG. 4.

In this specification, simultaneously activating and refreshing a plurality of sub-arrays A10, A11, A12, A13 means refreshing a plurality of sub-arrays A10, A11, A12, A13 in response to a single refresh command from the memory controller CTL. Therefore, it may occur that sub-arrays A10, A1, A12 and A13 are refreshed with a time lag among them. That is, that statement in the specification involves all cases in which sub-arrays A10, A11, A12, A13 are refreshed at substantially the same timing.

SECOND EMBODIMENT

Figure 5:
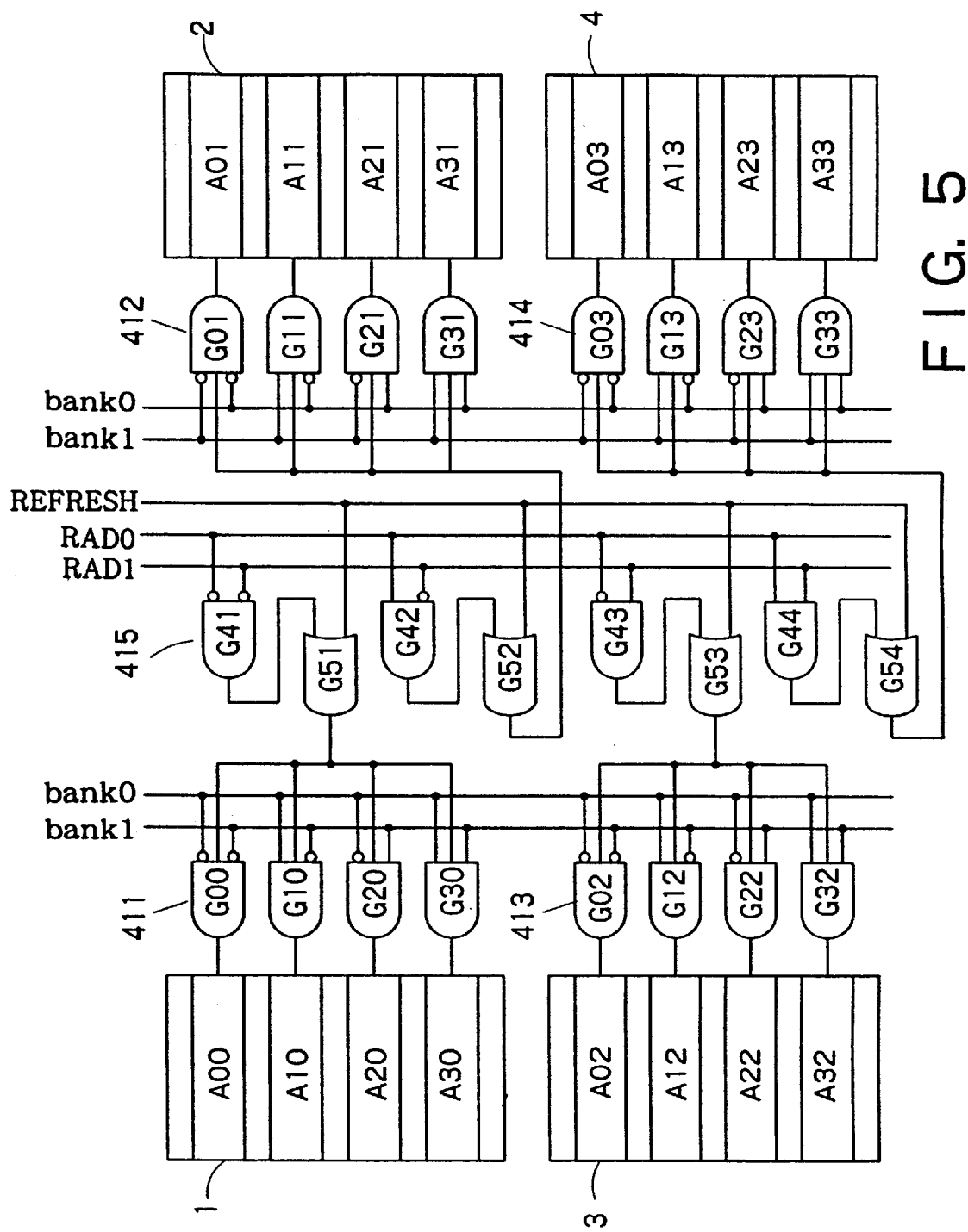
FIG. 5 is a diagram showing configuration of a second decoding circuit in the first embodiment of the invention (second embodiment)

FIG. 5 shows a circuit configuration of the second decoding circuit DC11 which enables simultaneous activation of a plurality of sub-arrays upon refreshment, based on the DRAM cell array configuration of FIG. 1. The second decoding circuit DC11 is supplied with a refresh control signal REFRESH, bank address bank0, bank1, row address RAD0 and RAD1 from the first decoding circuit DC10.

For individual cell array blocks 1 through 4, there are provided decode portions 411 through 414, respectively, for selecting sub-arrays in accordance with bank address bank0, bank1. AND gates G00, G10, G20, G30 of the decode portions 411 are provided for activating sub-arrays A00, A10, A20, A30 in the block 1. They detect coincidence between combinations of "0" and "1" in bank address bank0 and bank1, and only one of their outputs becomes active ("H"). This is common also the decode portions 412, 413, 414 of the other blocks.

Further provided is a decode portion 415 for selecting blocks in accordance with row address RAD0, RAD1 designating blocks. AND gates G41, G42, G43 and G44 of the decode portion 415 detect coincidence between combinations of "0" and "1" of row address RAD0 and RAD1, and only one of their outputs becomes active ("H"). Outputs from these AND gates G41, G42, G43 and G44 pass through OR gates G51, G52, G53, G54 together with the refresh control signal REFRESH, and enter into AND gates of the decode portions 411, 412, 413 and 414, respectively.

That is, decode portions 411 through 414 and 415 make up a decoding circuit for selecting a single sub-array in a single bank in accordance with bank address bank0, bank1 and row address RAD0 and RAD1 in the row access mode.

Portions of OR gates G51, G52, G53 and G54 in the decode portion 415 for selecting a block make up a refresh control circuit for restricting the block selecting function of the decoding circuit and simultaneously activating a plurality of sub-arrays in a single bank according to the refresh signal REFRESH in the refresh mode.

In the normal row access mode, the refresh signal REFRESH is "L". At that time, in response to the row address RAD0 and RAD1, one of outputs of the AND gates G41, G42, G43 and G44 in the decode portion 415 becomes "H". For example, if RAD0="0" and RAD1="0", output of the AND gate 41 becomes "H", and the block 1 is selected. As a result, AND gates G00 through G30 in the decode portion 411 of the block 1 turns out active. Then, one of the sub-arrays A00 through A30 is activated by the bank address bank0 and bank1. If bank0="0" and bank1="0", the AND gate G00 is activated, and the sub-array belonging to the bank B0 is activated.

In this manner, in the row access mode, one sub-array among 16 sub-arrays in four banks is activated by row address and bank address.

In contrast, in the refresh mode, the refresh signal REFRESH becomes "H". At that time, regardless of row address RAD0 and RAD1, REFRESH="H" passes through OR gates G51, G52, G53 and G54 of the decode portion 415, and the decode portions 411, 412, 413 and 414 of all blocks 1 through 4 are activated. And, if the bank address is bank0="0" and bank1="0", outputs of the AND gates G00, G0, G02 and G03 of the decode portions 411, 412, 413 and 414 become "H". That is, all sub-arrays A00, A01, A02 and A03 belonging to the bank B0 are activated simultaneously.

As explained above, in the second decode circuit DC11 according to the embodiment shown here, only one sub-array of a certain bank is activated in the row access mode, but all sub-arrays of a certain bank are simultaneously activated in the refresh mode. Then, since banks simultaneously activated for refresh operation are few, the load to the memory controller CTL1 is alleviated, and a high system performance is ensured, as already explained. Additionally, the probability of occurrence of operation constraints peculiar to the shared sense-amplifier system is reduced, and higher-speed operation is possible through the entire system.

THIRD EMBODIMENT

FIG. 6A shows configuration of a memory cell array MCA2 in a memory chip MEMC2 according to third embodiment. In this embodiment, every two sub-arrays (A00, A01), (A10, A11), (A20, A21), and (A30, A31) constitute banks B0, B1, B2 and B3, respectively. Two sub-arrays in each bank are located to interpose one of sub-arrays of another bank, and two sub-arrays does not commonly share a sense amplifier circuit in a bank. At opposite ends of the range of sub-arrays, independent sense amplifier circuits SAi not shared with others are located.

In the embodiment shown here, it is banks B1 and B3 that are located adjacent the bank B2, for example, and share a common sense amplifier circuit. Therefore, it has a DRAM configuration of substantially the same non-independent bank system as that of FIG. 1.

In case of this embodiment, when the bank B2, for example, is selected in the row access mode, what is activated is one of the sub-arrays A20 and A21. In contrast, in the refresh mode, when the bank B2 is selected, two sub-arrays A20 and A21 are activated simultaneously. This is possible because these two sub-arrays A20 and A21 do not share any sense amplifier circuit.

Control of the memory cell array MCA2 is managed by the memory controller CTL2, first decoding circuit DC20 and second decoding circuit DC21.

Therefore, this embodiment also improves the system performance similarly to the preceding embodiments.

Moreover, since sub-arrays in a single bank do not share a common sense amplifier, this embodiment enables simultaneously activating them even in the row access mode. That is, page length variable control is possible. In other words, this embodiment can satisfy both the demand for simultaneous activation of a plurality of sub-arrays upon refreshment and the demand for a page length variable mode.

Furthermore, in the embodiment shown in FIG. 6A, eight sub-arrays are arranged to share a sense amplifier circuit between every adjacent sub-arrays, and as illustrated, four banks B0 through B3 are designated by combining every other sub-arrays sequentially from the upper end of the arrangement as one bank. In this case, it is preferable to assign two-bit bank address bank0 and bank1 to the banks as follows.

TABLE 1

| bank0 | bank1 | bank |
|---|---|---|
| 0 | 0 | B0 |
| 1 | 0 | B1 |
| 0 | 1 | B2 |
| 1 | 1 | B3 |

That is, the upper end sub-array A00 of FIG. 6A belong to the bank B0 corresponding to the least significant one of bank addresses whereas the lower end sub-array A31 belongs to the bank B3 corresponding to the most significant one of bank addresses. When the bank addresses are established sequentially in correspondence with the arrangement of sub-arrays in this manner, control of the memory controller CTL2 is easy. Its reason is that, for controlling access in the DRAM of the non-independent bank system, although it is necessary to grasp which banks share a sense amplifier, by establishing bank addresses in accordance with the sub-array arrangement as explained above, configuration about common use of sense amplifier circuits among banks can be grasped more easily.

Figure 6B:
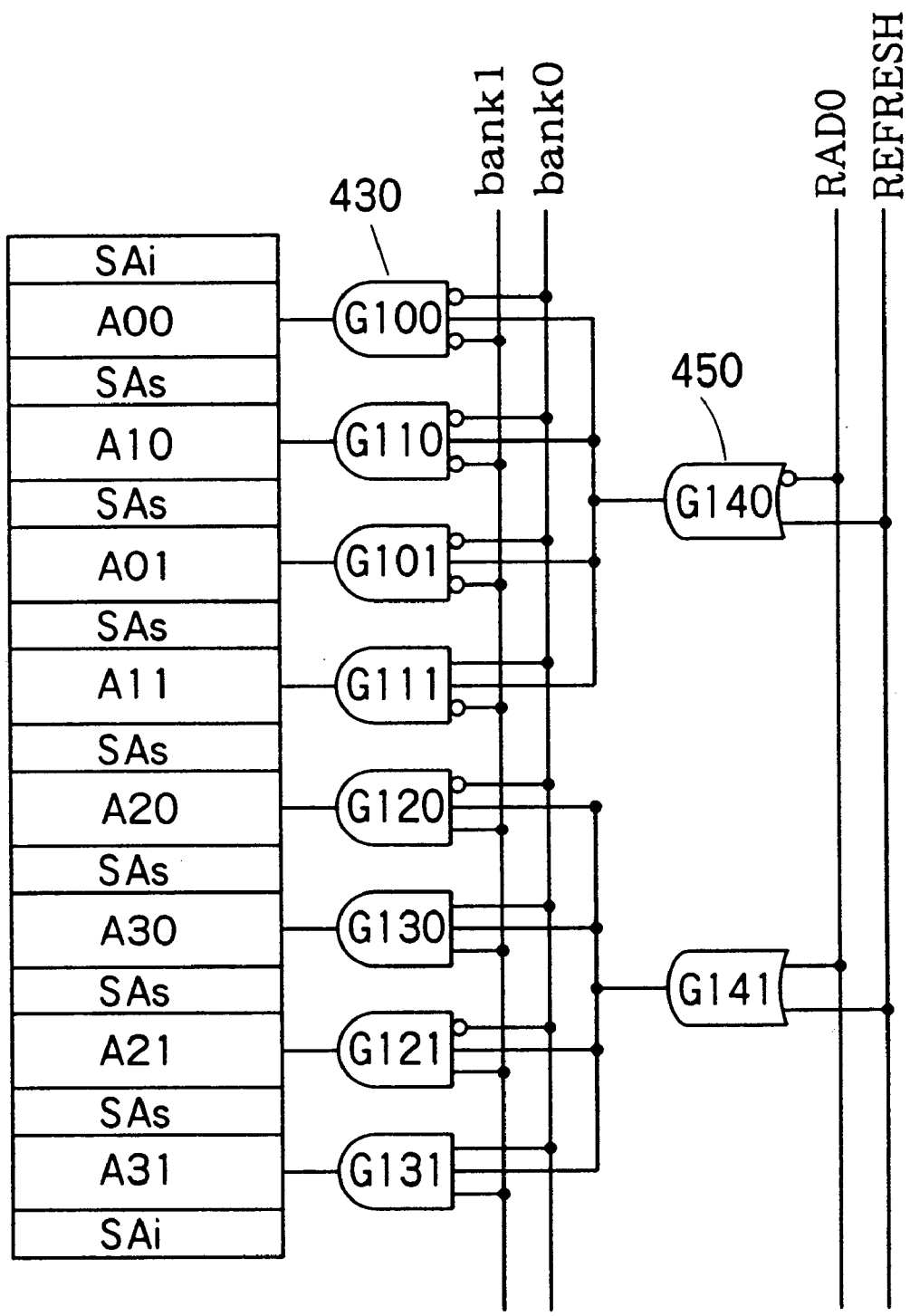
FIG. 6B is diagram showing configuration of a second decoding circuit in the same embodiment.

FIG. 6B shows an example of circuit configuration of the second decoding circuit DC21 in the same embodiment. As shown in FIG. 6B, the second decoding circuit DC21 is composed of the decode portions 420, 430. The decode portion 420 is supplied with bank address bank0 and bank1 from the first decoding circuit DC20. The decode portion 430 is supplied with the row address RAD0 and the refresh control signal REFRESH from the first decoding circuit DC20.

The decode portion 420 includes AND gates G100, G110, G101, G111, G120, G130, G121 and G131. The decode portion 430 includes OR gates G140 and G141.

OR gates G140 and G141 of the decode portion 430 are supplied with the row address RAD0 in the original or inverted form. Therefore, in the decode portion 430, one sub-array is selected from each of the banks B0, B1, B2 and B3 in accordance with the row address RAD0. Additionally, the decode portion 430 is supplied with the refresh control signal REFRESH. Output of the OR gate 140 of the decode portion 430 is input to the AND gates G100, G110, G120 and G130. Output of the OR gate 141 is input to the AND gates G101, G111, G121 and G131.

AND gates G100, G110, G101, G111, G120, G130, G121 and G131 are supplied with bank address bank0 and bank1 in the original or inverted form. Therefore, in the decode portion 430, one bank is selected. That is, two sub-arrays in one bank are selected.

Specifically, in the row access mode, one sub-array in one bank is selectively activated by bank address bank0, bank1 and row address RAD0. For example, in the case where bank address bank0="0", bank address bank1="0", and row address RAD0="0", since the row address RAD0="0", output of the OR gate G140 turns out "H". This output of the OR gate 140 is input to the AND gates G100, G110, G120 and G130. Further, since the bank address bank0="0" and bank address bank1="0", output of the AND gate G100 in the decode portion 420 becomes "H". As a result, the sub-array A00 is selected and activated.

In the refresh mode, one bank is selectively activated by the bank address bank0 and bank1. Assume here, for example, that the bank address bank0="0", and the bank address bank1="0". In the refresh mode, since the refresh control signal REFRESH="1", outputs of the OR gates G140 and G141 become "H". These outputs of the OR gates are input to the AND gates G100, G110, G101, G111, G120, G130, G121 and G131. Further, since the bank address bank0="0" and the bank address bank1="0", outputs of the AND gates G100 and G101 in the decode portion 420 become "H". As a result, sub-arrays A00 and A01 are selected and activated. That is, two sub-arrays A00 and A01 are refreshed simultaneously.

FOURTH EMBODIMENT

Figure 7A:
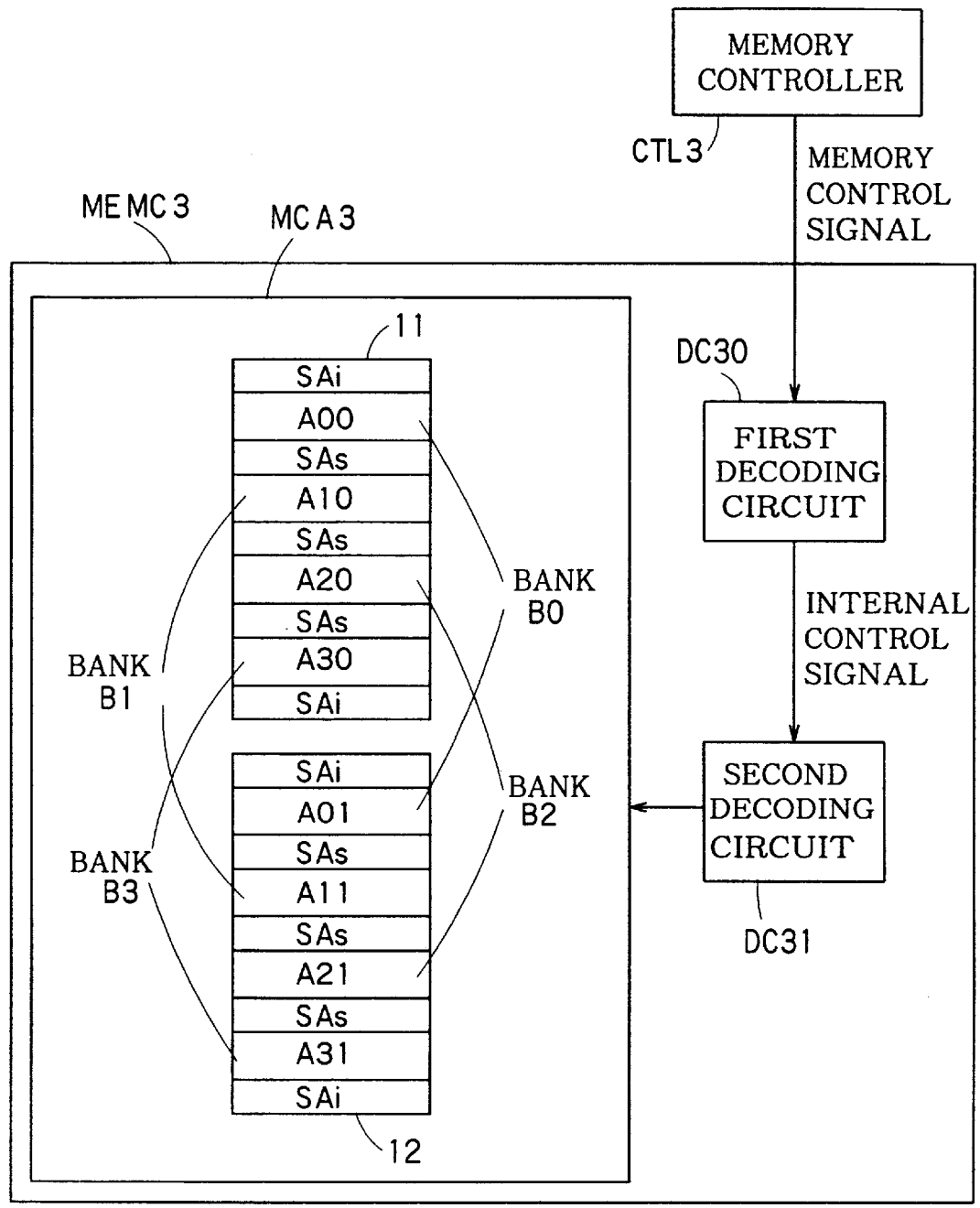
FIG. 7A is a diagram showing configuration of a dynamic random access memory device according to the fourth embodiment of the invention.

FIG. 7A shows configuration of a memory cell array MAC3 in a memory chip MEMC3 according to the fourth embodiment. This embodiment is the same as the embodiment shown in FIG. 6A in that every two sub-arrays (A00, A01), (A10, A11), (A20, A21), and (A30, A31) constitute banks B0, B1, B2 and B3, respectively. As to the arrangement of sub-arrays, however, it is different from the embodiment of FIG. 6A. That is, A00, A10, A20 and A30, which are counterparts of respective banks, are disposed in one block 11, and A01, A11, A21 and A31, which are the other counterparts of respective banks, are disposed in another block 12. It is the same as the preceding embodiments that sub-arrays commonly share sense amplifier circuits SAs within each block 11 or 12. Additionally, at opposite ends of each block 11, 12, independent sense amplifier circuits SAi not shared with others are provided.

Although this embodiment avoids common use of a sense amplifier circuit between sub-arrays A30 and A01, it is the same as the embodiment of FIG. 6A in employing the non-independent bank system in which a sense amplifier circuit is shared by banks, namely between B0 and B1, between B1 and B2, and between B2 and B3, respectively.

Also in this embodiment, when the bank B2, for example, is selected in the row access mode, what is activated is one of the sub-arrays A20 and A21. In contrast, in the refresh mode, when the bank B2 is selected, two sub-arrays A20 and A21 can be activated simultaneously.

Control of the memory cell array MCA3 is managed by the memory controller CTL3, first decoding circuit DC30 and second decoding circuit DC31. Thereby, the system performance is improved.

In the DRAM cell array according to this embodiment, two blocks 11 and 12 are independent from each other. This is advantageous for simultaneously fabricating a version with a half DRAM total capacity, using a common design.

FIG. 7B shows circuit configuration of the second decoding circuit DC31 in the same embodiment. As shown in FIG. 7B, the second decoding circuit DC31 is composed of decode portions 440, 441 and 450. The decode portions 440 and 441 are supplied with bank address bank0 and bank1 from the first decoding circuit DC30. The decode portion 450 is supplied with row address RAD0 and the refresh control signal REFRESH from the first decoding circuit DC30.

The decode portion 440 includes AND gates G200, G210, G220 and G230. The decode portion 441 includes AND gates G201, G211, G221 and G231. The decode portion 450 includes OR gates G240 and G241.

OR gates G240 and G241 of the decode portion 450 are supplied with the row address RAD0 in the original or inverted form. Therefore, in the decode portion 450, one sub-array is selected from each of the banks B0, B1, B2 and B3 in accordance with the row address RAD0. Additionally, this decode portion 450 is supplied with the refresh control signal REFRESH.

Output of the OR gate 240 is input to the AND gates G200, G210, G220 and G230. Output of the OR gate 241 is input to the AND gates G201, G211, G221 and G231.

AND gates G200, G210, G220, G230, G201, G211, G221 and G231 of the decode portions 440 and 441 are supplied with bank address bank0 and bank1 in the original or inverted form. Therefore, in the decode portions 440 and 441, one bank is selected. That is, two sub-arrays in one bank are selected.

Specifically, in the row access mode, one sub-array in one bank is selectively activated by bank address bank0, bank1 and row address RAD0. For example, in the case where bank address bank0="0", bank address bank1="0", and row address RAD0="0", since the row address RAD0="0", output of the OR gate G240 turns out "H". This output of the OR gate 240 is input to the AND gates G200, G210, G220 and G230. Further, since the bank address bank0="0" and bank address bank1="0", output of the AND gate G200 in the decode portion 440 becomes "H". As a result, the sub-array A00 is selected and activated.

In the refresh mode, one bank is selectively activated by the bank address bank0 and bank1. Assume here, for example, that the bank address bank0="0", and the bank address bank1="0". In the refresh mode, since the refresh control signal REFRESH="1", outputs of the OR gates G240 and G241 become "H" altogether. These outputs of the OR gates are input to the AND gates G200, G210, G220, G230, G201, G211, G221 and G231. Further, since the bank address bank0="0" and the bank address bank1="0", the output of the AND gate G200 in the decode portion 440 and the output of the AND gate G201 in the decode portion 441 become "H". As a result, sub-arrays A00 and A01 are selected and activated. That is, two sub-arrays A00 and A01 are refreshed simultaneously.

FIFTH EMBODIMENT

Figure 8A:
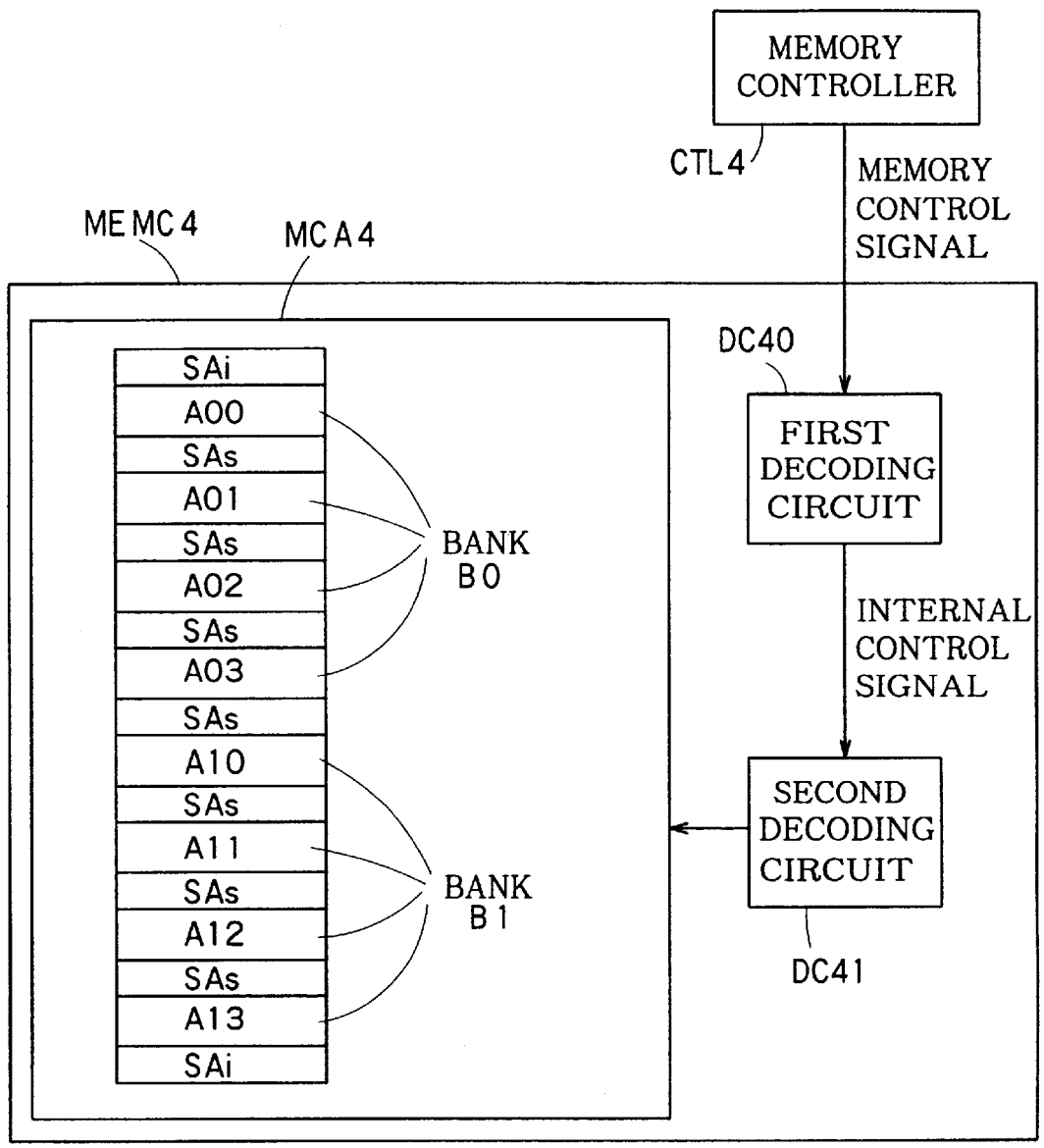
FIG. 8A is a diagram showing configuration of a dynamic random access memory device according to the fifth embodiment of the invention.

FIG. 8A shows configuration of a memory cell array MAC4 in a memory chip MEMC4 according to the fourth embodiment. The preceding embodiments are configured not share sense amplifiers among sub-arrays in a common bank. In this embodiment, however, four sub-arrays A00, A01, A02 and A03 arranged to share sense amplifier circuit SAs make up one bank B0, and four sub-arrays A10, A11, A12 and A13 arranged to share sense amplifier circuit SAs make up another bank B1. This is also a non-independent bank system, having a shared sense amplifier circuit SAs between the banks B0 and B1.

In case of this embodiment, when the bank B0, for example, is selected in the row access mode, what is activated is one of the sub-arrays A00 through A03. In contrast, in the refresh mode, when the bank B0 is selected, two sub-arrays A00 and A02, for example, which do not share a sense amplifier circuit can be activated simultaneously. Unlike the preceding embodiments, since there are shared sense amplifier circuits in each bank, it is not possible to simultaneously refresh all sub-arrays. However, by simultaneously refreshing more sub-arrays at least than those in the row access mode, the system performance is improved.

Control of the memory cell array MCA4 is managed by the memory controller CTL4, first decoding circuit DC40 and second decoding circuit DC41.

Figure 8B:
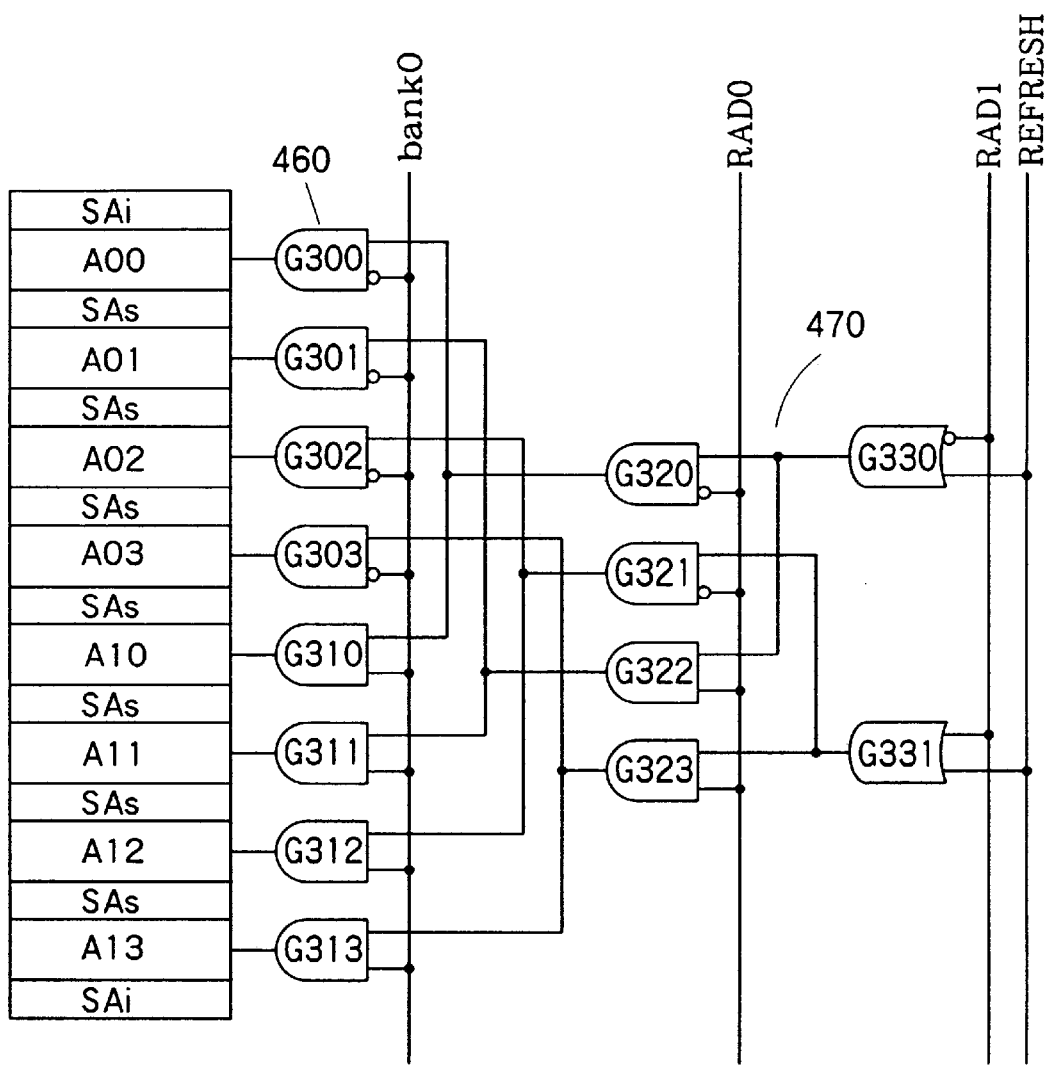
FIG. 8B is diagram showing configuration of a second decoding circuit in the same embodiment.

FIG. 8B shows circuit configuration of the second decoding circuit DC41 in the same embodiment. As shown in FIG. 8B, the second decoding circuit DC41 is composed of decode portions 460 and 470. The decode portion 460 is supplied with the bank address bank0 from the first decoding circuit DC40. The decode portion 470 is supplied with row address RAD0, RAD1 and refresh control signal REFRESH from the first decoding circuit DC40.

The decode portion 460 includes AND gates G300, G301, G302, G303, G310, G311, G312 and G313. The decode portion 470 includes AND gates G320, G321, G322 and G323, and OR gates G330 and G331.

The decode portion 470 is supplied with row address RAD0, RAD1 and refresh control signal REFRESH. More specifically, the row address RAD1 is introduced in the inverted form into the OR gate 330 of the decode portion 470 and in the original form to the OR gate G331. The OR gates G330 and G331 are also supplied with refresh control signal REFRESH. Output of the OR gate 330 is input to the AND gates G320 and G322, and output of the OR gate G331 is input to the AND gates G321 and G323.

Further, the row address RAD0 is input in the inverted form to the AND gates G320 and G321, and in the original form to the AND gates G322 and G323. Output of the AND gate G320 is input to the AND gates G300 and G310 of the decode portion 460. Output of the AND gate G321 is input to the AND gates G302 and G312 of the decode portion 460. Output of the AND gate 322 is input to the AND gates G301 and G311 of the decode portion 460. Output of the AND gates G323 is input to the AND gates G303 and G313 of the decode portion 460.

Therefore, in the decode portion 470, one sub-array is selected from each of the banks B0 and B1 in accordance with the row address RAD0 and RAD1.

AND gates G300, G301, G302 and G303 are supplied with the bank address bank0 in the inverted form. AND gates G310, G311, G312 and G313 is supplied with the bank address bank0 in the original form. Therefore, in the decode portion 460, one bank is selected on the basis of the bank address bank0. That is, four sub-arrays in one bank are selected.

Specifically, in the row access mode, one sub-array in one bank is selectively activated by bank address bank0 and row address RAD0 and RAD1. For example, in the case where bank address bank0="0", row address RAD0="0", and row address RAD1="0", since the row address RAD1="0", output of the OR gate G330 turns out "H". This output of the OR gate 330 is input to the AND gates G320 and G322. Further, since the row address RAD0="0", output of the AND gate G320 becomes "H". This output of the AND gate 320 is input to the AND gates G300 and G310. At that time, since the bank address bank0="0", output of the AND gate G300 in the decode portion 460 becomes "H". As a result, the sub-array A00 is selected and activated.

In the refresh mode, sub-arrays not sharing sense amplifier circuits SAs in one bank are selectively activated by the bank address bank0 and bank1. Assume here, for example, that the bank address bank0="0", row address RAD0="0", and row address RAD1="0". In the refresh mode, since the refresh control signal REFRESH="1", outputs of the OR gates G330 and G331 become "H" altogether. These outputs of the OR gates are input to the AND gates G320, G321, G322 and G323. Further, since the row address RAD0="0", outputs of the AND gates G320 and G321 become "H". These output of the AND gates G320 and G321 are input to the AND gates G300, G302, G310 and G312 of the decode portion 460.

Furthermore, since the bank address bank0="0", output of the AND gates G300 and G302 of the decode portion 460 become "H". As a result, sub-arrays A00 and A02 are selected and activated. That is, two sub-arrays A00 and A02 are refreshed simultaneously.

SIXTH EMBODIMENT

FIG. 9 shows a DRAM configured to use a page-length variable circuit as the refresh control circuit. Here is used the same DRAM cell array configuration as that of the embodiment shown in FIG. 7A. The "page length" is the length of data latched in a sense amplifier by selection of one row, and it is the size of data that can be taken out solely by column access after selection of a row.

In FIG. 9, decode portions 81 and 82 decode bank address bank0 and bank1 and select sub-arrays for blocks 11 and 12, respectively. When bank0="0" and bank1="0",outputs of AND gates G00 and G01 become "H", and sub-arrays A00 and A01 of the bank B0 are selected. When bank0="1" and bank1="0", outputs of AND gates G10 and G11 become "H", and sub-arrays A10 and A11 of the bank B1 are selected. When bank0="0" and bank1="1", outputs of AND gates G20 and G21 become "H", and sub-arrays A20 and A21 of the bank B2 are selected. When bank0="1" and bank1="1", outputs of AND gates G30 and G31 become "H", and sub-arrays A30 and A31 of the bank B3 are selected.

The decode portions 81 and 82, however, are selectively activated by the decode portion 83 which decodes block designating address RAD0 and RAD1. When RAD0="0" and RAD1="0", output of the AND gate G81 becomes "H", and it is transferred to the decode portion 81 for the block 11 through the OR gate G83 to activate the decode portion 81.

When RAD0="1" and RAD1="0", output of the AND gate G82 becomes "H", and the decode portion 82 for the block 11 is activated.

Further, a page length variable signal LONGPAGE enters into OR gates G83 and G84 of the decode portion 83 for block selection. When LONGPAGE="L", only one of the blocks 11 and 12 is activated by the decode portion 83. When LONGPAGE="H", however, address RAD0 and RAD1 are disregarded, and both decode portions 81 and 82 of both blocks 11 and 12 are activated. That is, two sub-arrays belonging to a bank selected by bank address bank0 and bank1 are activated simultaneously. This is the long page mode.

The above-mentioned page length variable function is typically used as an optional function which is fixed prior to shipment of DRAMs and never changed later. Taking it into account, this embodiment uses the page length variable function for refresh operation. More specifically, in the case where a DRAM chip is fixed in a short page length mode, since the signal line for the page length variable signal LONGPAGE is not necessary, it is used as a refresh signal line. That is, by setting LONGPAGE="H" in the refresh mode, two sub-arrays in a certain bank can be activated simultaneously.

As a result, it is possible to suppress the probability of occurrence of operation constraints before and after refresh operation in the non-independent bank system and obtain a high system performance. Additionally, by using the page length variable function circuit for the refresh control purpose, the chip area need not be increased.

SEVENTH EMBODIMENT

Figure 10:
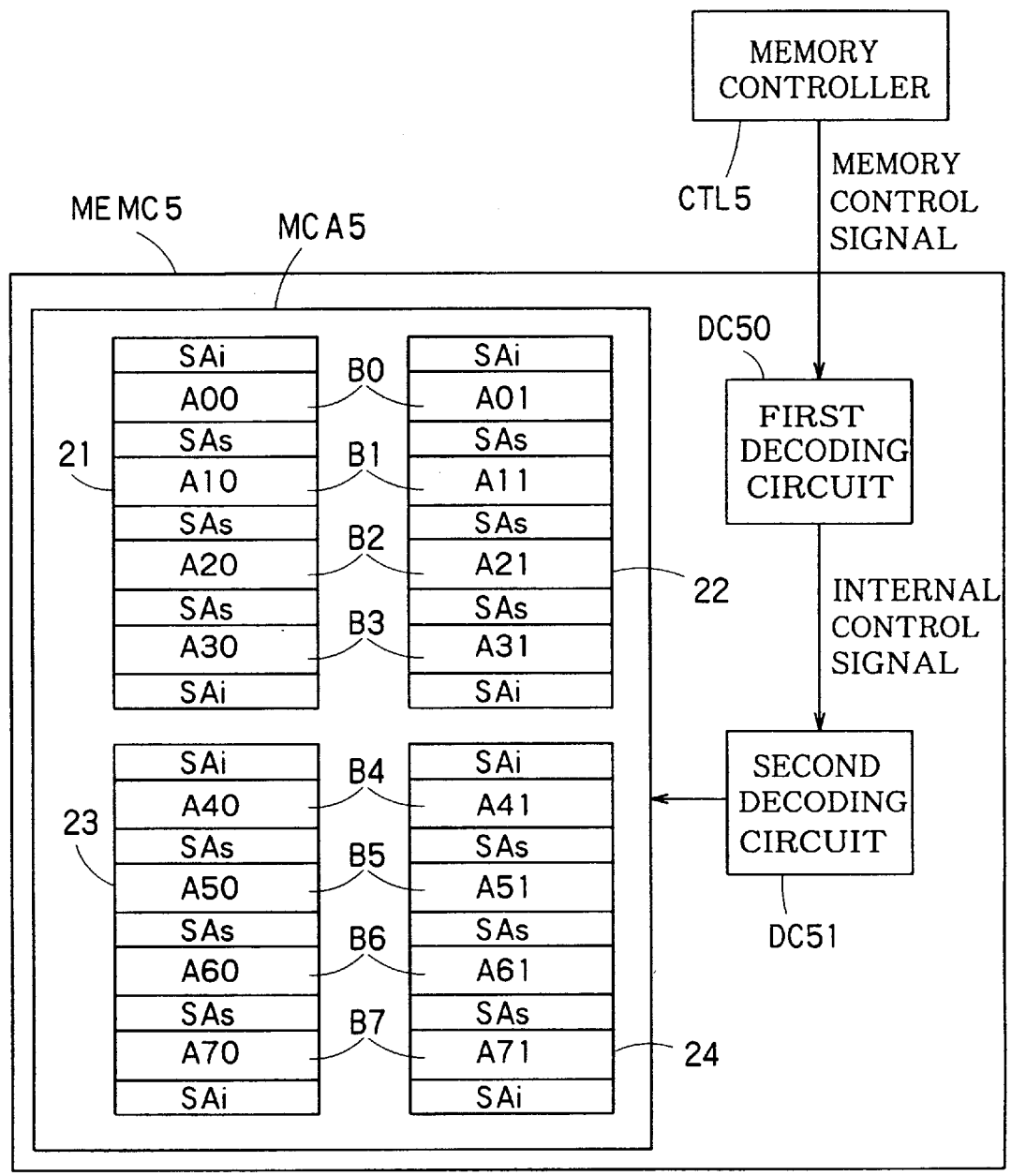
FIG. 10 is a diagram showing configuration of a dynamic random access memory device according to the seventh embodiment of the invention.

FIG. 10 shows configuration of a memory cell array MCA5 in a memory chip MEMC5 according to the seventh embodiment. In this embodiment, there are four blocks 21, 22, 23, and 24 each including four sub-arrays, and every adjacent sub-arrays in each block share a sense amplifier circuit SAs. Groups of sub-arrays (A00, A01), (A10, A11), (A20, A21) and (A30, A31) in the upper left and right blocks 21 and 22 make up the banks B0, B1, B2 and B3, respectively. Similarly, groups of sub-arrays (A40, A41), (A50, A51), (A60, A61) and (A70, A71) in the lower left and right blocks 23 and 24 make up the banks B4, B5, B6 and B7, respectively.

That is, banks B0 through B3 have a non-independent bank configuration in which two sub-arrays in each bank do not share a sense amplifier circuit, but a common sense amplifier circuit is shared between adjacent banks. Independently from it, banks B4 through B7 similarly make up a non-independent bank configuration.

In the embodiment shown here, when the bank B2 is selected, for example, in the normal row access mode, what is activated is one of the sub-arrays A20 and A21. In the refresh mode, two sub-arrays A20 and A21 in the bank B2 can be activated simultaneously. Therefore, it is possible to reduce the number of banks simultaneously activated, and improve the system performance.

Control of the memory cell array MCA5 is managed by the memory controller CTL5, first decoding circuit DC50 and second decoding circuit DC51.

Figure 11:
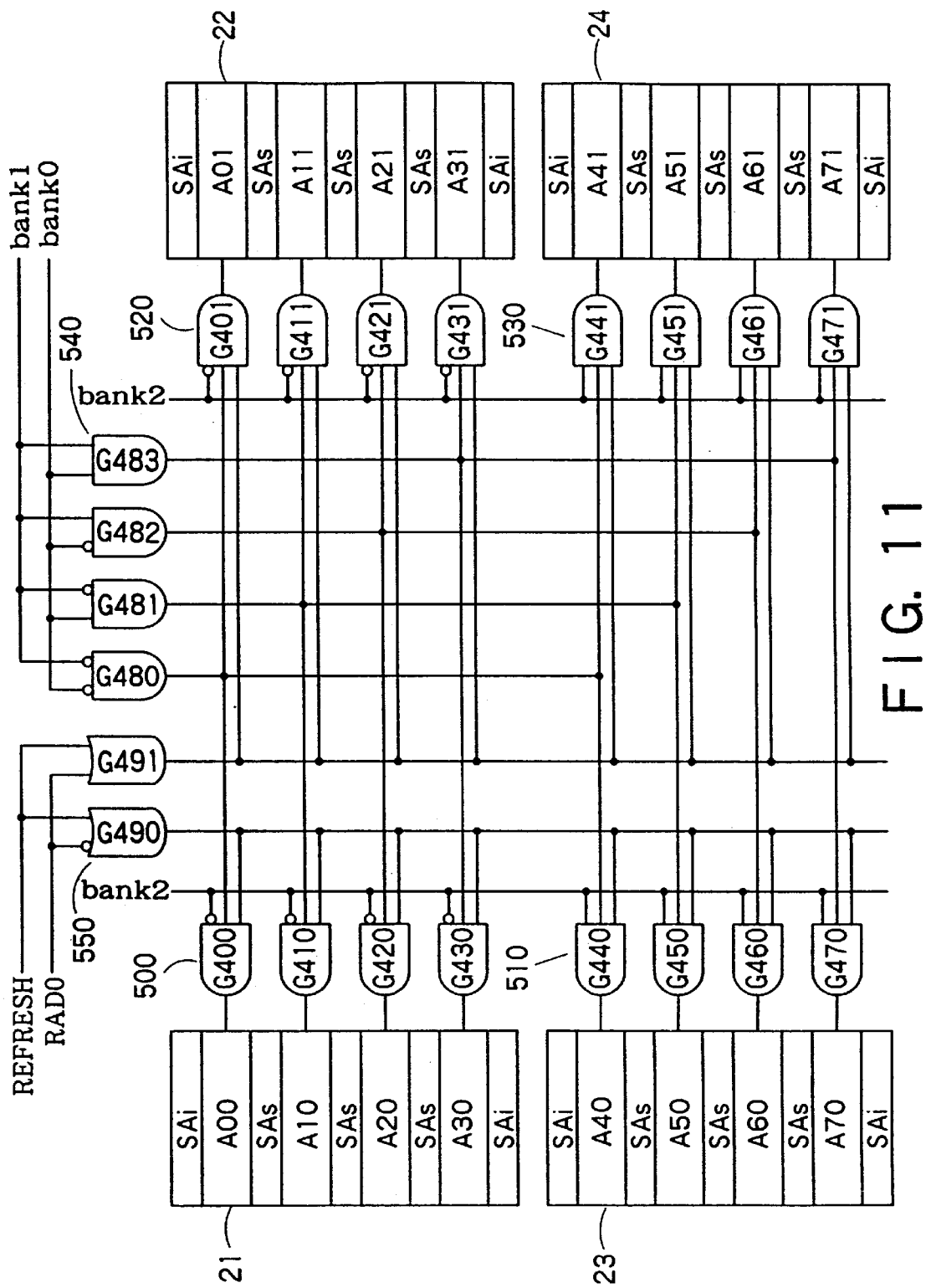
FIG. 11 is diagram showing configuration of a second decoding circuit in the same embodiment.

FIG. 11 shows circuit configuration of the second decoding circuit DC51 in the same embodiment. As shown in FIG. 11, the second decoding circuit DC51 is composed of decode portions 500, 510, 520, 530, 540 and 550. The decode portions 500, 510, 520, 530 and 540 are supplied with the bank address bank0, bank1 and bank2 from the first decoding circuit DC50. The decode portion 550 is supplied with row address RAD0 and refresh control signal REFRESH from the first decoding circuit DC50.

The decode portion 500 includes AND gates G400, G410, G420 and G430. The decode portion 510 includes AND gates G440, G450, G460 and G470. The decode portion 520 includes AND gates G401, G411, G421 and G431. The decode portion 530 includes AND gates G441, G451, G461 and G471. The decode portion 540 includes AND gates G480, G481, G482 and G483. The decode portion 550 includes OR gates G490 and G491.

The decode portion 550 selects one of the group of blocks 21 and 23 and the group of blocks 22 and 24 in response to the row address RAD0. The decode portion 540 selects one sub-array from each of the blocks 21, 22, 23 and 24, in response to the bank address bank0 and bank1. The decode portions 500 and 510 select one of blocks 21 and 23 in response to the bank address bank2. The decode portions 520 and 530 select one of the blocks 22 and 24 in response to the bank address bank2.

More specifically, in the row access mode, one sub-array in one bank is selectively activated by the bank address bank0, bank1, bank2 and row address RAD0. For example, assume that the bank address bank0="0", bank address bank1="0", bank address bank2="0", and row address RAD0="0". In this case, since the row address RAD0="0", output of the OR gate G490 becomes "H". This output of the OR gate 490 is input to the AND gates G400, G410, G420 and G430, and input to the AND gates G440, G450, G460 and G470.

Still in the same example, since the bank address bank0="0", and the bank address bank1="0", output of the AND gate G480 becomes "H". This output of the AND gate G480 is input to the AND gates G400, G401, G440 and G441. Furthermore, since the bank address bank2="0", output of the AND gate G400 becomes "H". As a result, the sub-array A00 is selected and activated.

On the other hand, in the refresh mode, two sub-arrays in one block are selectively activated by the bank address bank0, address bank0="0", bank address bank1=="0", and bank address bank2="0". In case of the refresh mode, since the refresh control signal REFRESH ="1", outputs of the OR gates G490 and G491 become "H". These outputs from the OR gates G490 and G491 are input to all AND gates.

Further, since the bank address bank0="0" and the bank address bank1="0", output of the AND gate G480 becomes "H". This output of the AND gate G480 is input to the AND gates G400, G401, G440 and G441. Furthermore, since the bank address bank2"0", outputs of the AND gate 400 in the decode portion 500 and the AND gate G401 in the decode portion 520 become "H". As a result, sub-arrays A00 and A01 are selected and activated. That is, two sub-arrays A00 and A01 are refreshed simultaneously.

EIGHTH EMBODIMENT

The eighth embodiment of the invention is directed to a semiconductor integrating circuit device incorporating the dynamic random access memory device according to the first embodiment already explained together with a logic circuit.

FIG. 12 is a diagram showing configuration of a semiconductor integrated circuit device 100 according to the eighth embodiment. As shown in FIG. 12, the semiconductor integrated circuit device 100 according to the eighth embodiment is composed by adding a logic circuit LG10 to the dynamic random access memory device according to the first embodiment already explained. The logic circuit LG10 is a circuit for executing various logical operations. During such logical operations, if there occurs the need for writing data in a memory macro MM1 or reading data out of the memory macro MM1, the logic circuit LG10 issues a necessary request to the memory controller CTL1 as a controller control signal. Also when a request for writing data into the memory macro MM1 is input from outside to the logic circuit LG10, or a request for reading data is input from outside to the logic circuit LG10, the logic circuit LG10 sends a necessary request as the controller control signal to the memory controller CTL1.

The controller control signal may include an address in the memory macro MM1 in the original form, or in form of information designating the next address, for example, so that the memory controller CTL1 generates the address in the memory macro MM1 on the basis of the information.

Control of the cycle of refresh requests to the memory macro MM1 may be managed either by the logic circuit LG10 or by the memory controller CTL1. If the memory controller CTL1 manages refresh requests, a busy signal is transmitted from the memory controller CTL1 to the logic circuit LG10 in the refresh period.

Upon receipt of the controller control signal, the memory controller CTL1 generates a memory control signal based on the controller control signal, and supplies it to the first decoding circuit DC10 of the memory macro MM1. If the memory controller CTL1 manages refresh requests, it generates the memory control signal under its own control, and supplies it to the first decoding circuit DC10. Subsequent operations are substantially the same as the first embodiment.

Figure 13:
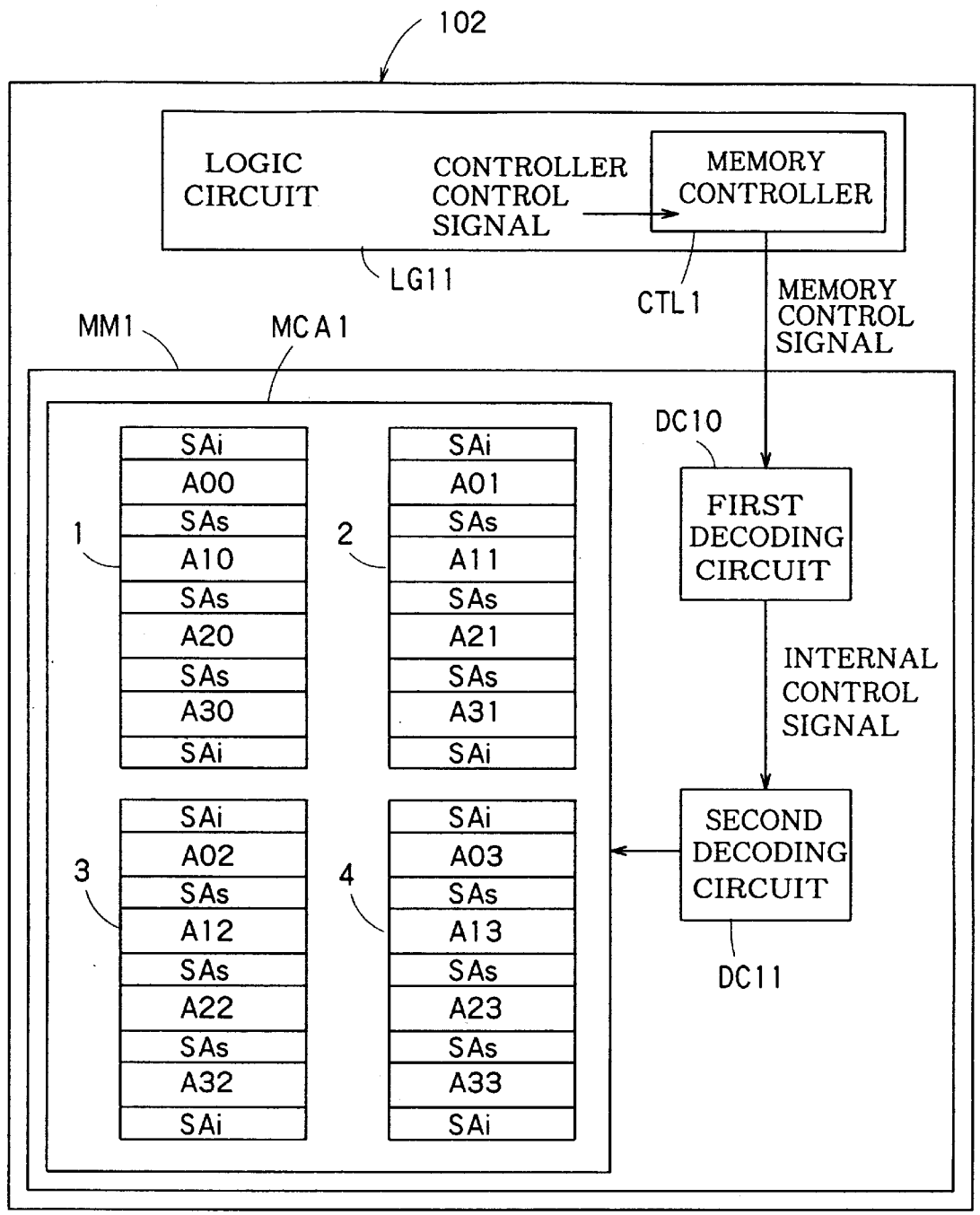
FIG. 13 is a diagram showing inside configuration of the semiconductor integrating circuit device in the eighth embodiment (when the memory controller is formed inside the logic circuit)

FIG. 13 is a diagram showing another version of the eighth embodiment of the invention. As shown in FIG. 13, the semiconductor integrated circuit device 102 includes the memory controller CTL1 inside the logic circuit LG11. The memory controller CTL1 operates as a part of the logic circuit LG11, and generates a memory control signal in response to the controller control signal received from a portion other than the memory controller CTL1 of the logic circuit LG11, or under its own control. This memory control signal is supplied from the memory controller CTL1 to the first decoding circuit DC10 of the memory macro MM1.

FIG. 14 is a block diagram showing configuration of a semiconductor integrating circuit device 104 taken as still another modification. As shown in FIG. 14, the first decoding circuit DC10 may be provided in the logic circuit LG12. In this case, a control signal corresponding to the memory control signal is supplied from the memory controller CTL1 to the first decoding circuit DC10. Then, a control signal corresponding to the internal control signal from the first decoding circuit DC10 is supplied to the second decoding circuit DC11.

Figure 15:
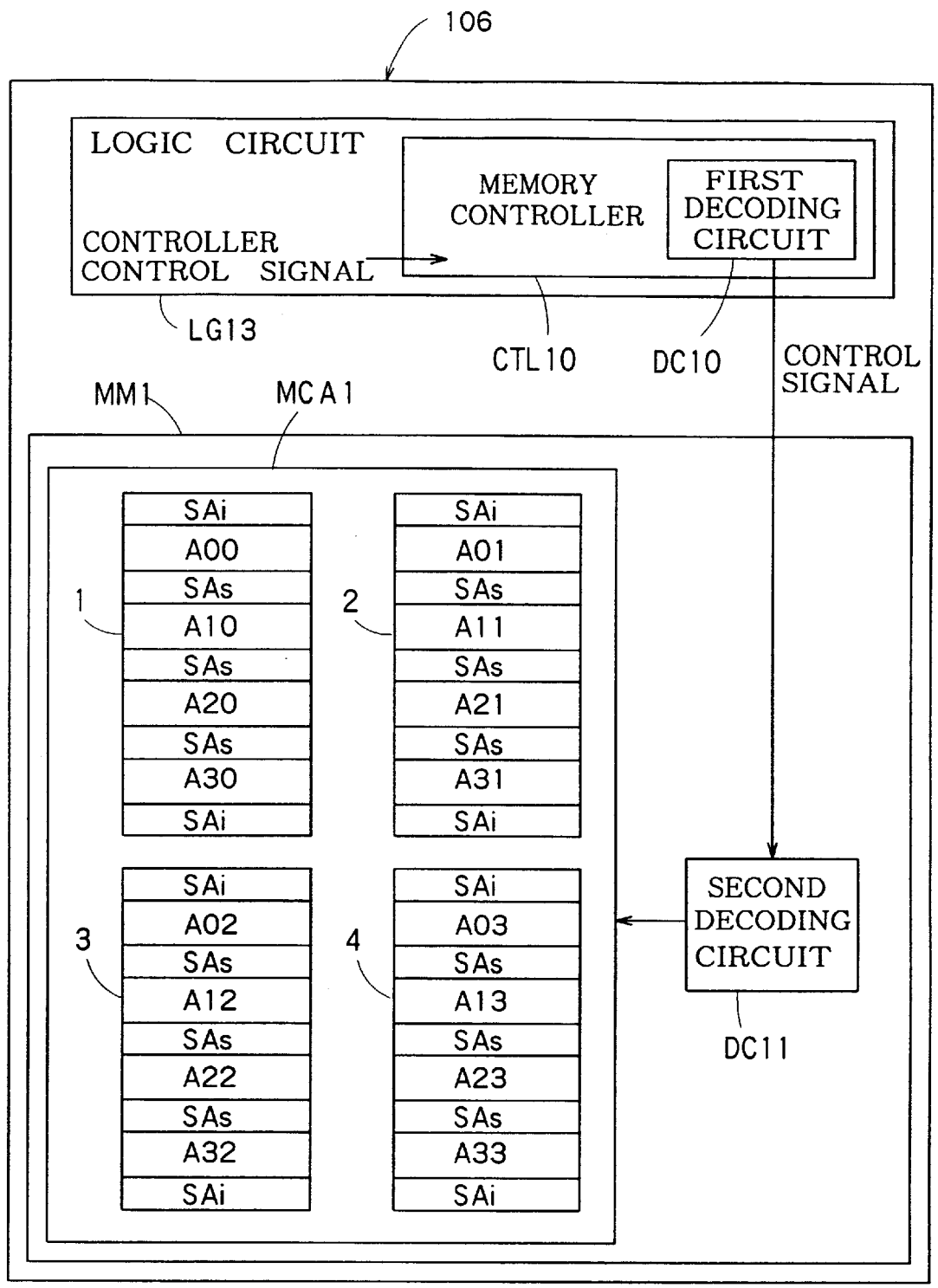
FIG. 15 is a diagram showing inside configuration of the semiconductor integrating circuit device in the eighth embodiment (when the memory controller is formed inside the logic circuit, and the first decoding circuit is provided inside the memory controller)

FIG. 15 is a block diagram showing configuration of a semiconductor integrated circuit device 106 as yet another modification. As shown in FIG. 15, the first decode circuit DC10 may be provided inside the memory controller CTL10. In this case, pursuant to an instruction tom the memory controller CTL10, the first decoding circuit DC10 generates a control signal corresponding to the internal control signal, and supplies it to the second decoding circuit DC11.

Inside configuration of the second decoding circuit DC11 in FIGS. 12 through 15 is substantially the same as FIG. 5 shown with reference to the first embodiment.

As explained above, the invention is applicable also to a semiconductor integrated circuit device incorporating a DRAM and a logic circuit.

NINTH EMBODIMENT

The ninth embodiment of the invention is directed to a semiconductor integrating circuit device incorporating the dynamic random access memory device according to the third embodiment already explained together with a logic circuit.

Figure 16:
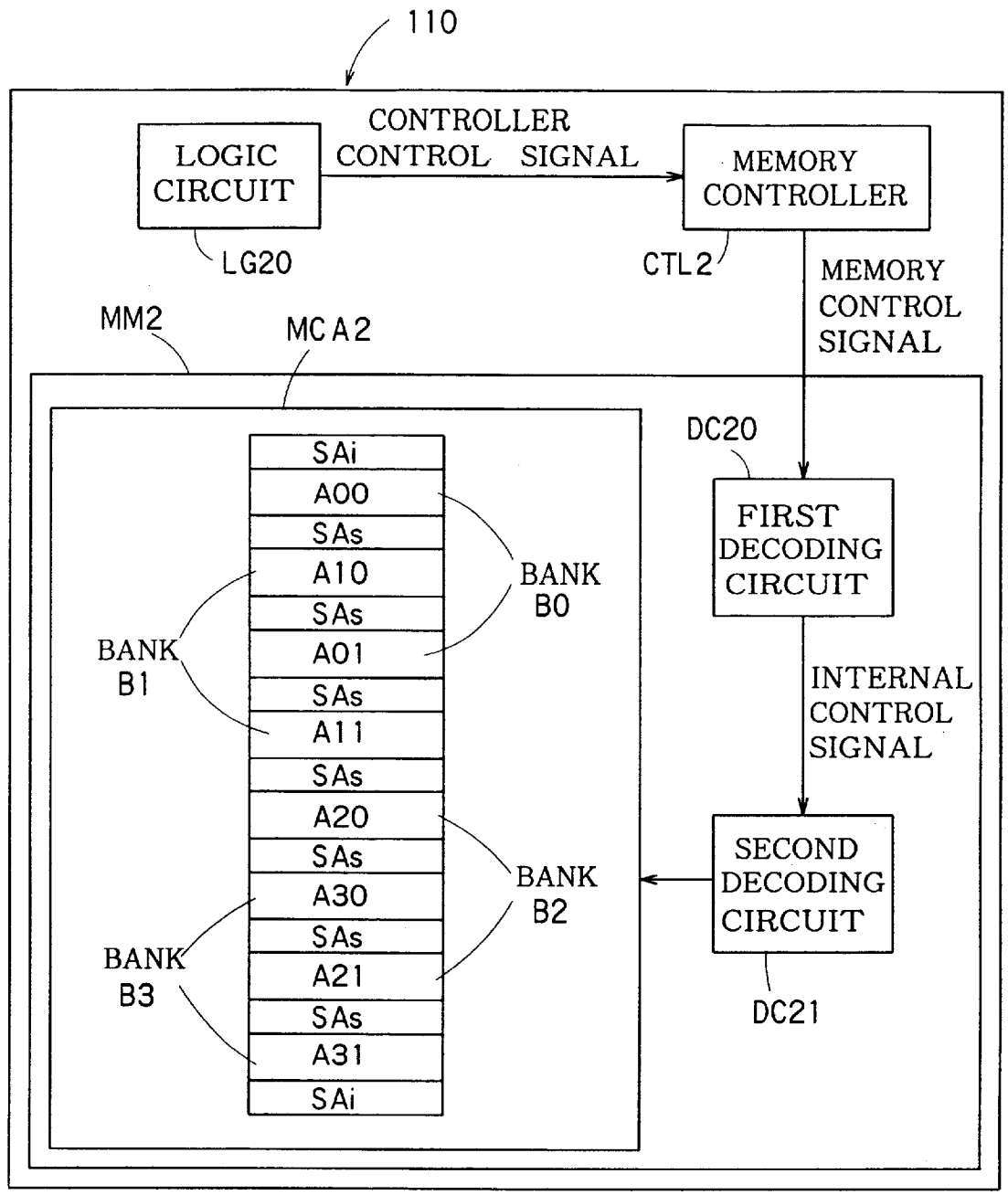
FIG. 16 is a diagram showing inside configuration of the semiconductor integrating circuit device in the ninth embodiment (when the logic circuit and the memory controller are formed separately)

FIG. 16 is a diagram showing configuration of a semiconductor integrated circuit device 110 according to the ninth embodiment. As shown in FIG. 16, the semiconductor integrated circuit device 110 according to the ninth embodiment is composed by adding a logic circuit LG20 to the dynamic random access memory device according to the third embodiment already explained. The logic circuit LG20 is a circuit for executing various logical operations. During such logical operations, if there occurs the need for writing data in a memory macro MM2 or reading data out of the memory macro MM2, the logic circuit LG20 issues a necessary request to the memory controller CTL2 as a controller control signal. Also when a request for writing data into the memory macro MM2 is input from outside to the logic circuit LG20, or a request for reading data is input from outside to the logic circuit LG20, the logic circuit LG20 sends a necessary request as the controller control signal to the memory controller CTL2.

The controller control signal may include an address in the memory macro MM2 in the original form, or in form of information designating the next address, for example, so that the memory controller CTL2 generates the address in the memory macro MM2 on the basis of the information.

Control of the cycle of refresh requests to the memory macro MM2 may be managed either by the logic circuit LG20 or by the memory controller CTL2. If the memory controller CTL2 manages refresh requests, a busy signal is transmitted from the memory controller CTL2 to the logic circuit LG20 in the refresh period.

Upon receipt of the controller control signal, the memory controller CTL2 generates a memory control signal based on the controller control signal, and supplies it to the first decoding circuit DC20 of the memory macro MM2. If the memory controller CTL2 manages refresh requests, it generates the memory control signal under its own control, and supplies it to the first decoding circuit DC20. Subsequent operations are substantially the same as the third embodiment.

FIG. 17 is a diagram showing another version of the ninth embodiment of the invention. As shown in FIG. 17, the semiconductor integrated circuit device 112 includes the memory controller CTL2 inside the logic circuit LG21. The memory controller CTL2 operates as a part of the logic circuit LG21, and generates a memory control signal in response to the controller control signal received from a portion other than the memory controller CTL2 of the logic circuit LG21, or under its own control. This memory control signal is supplied from the memory controller CTL2 to the first decoding circuit DC20 of the memory macro MM2.

Figure 18:
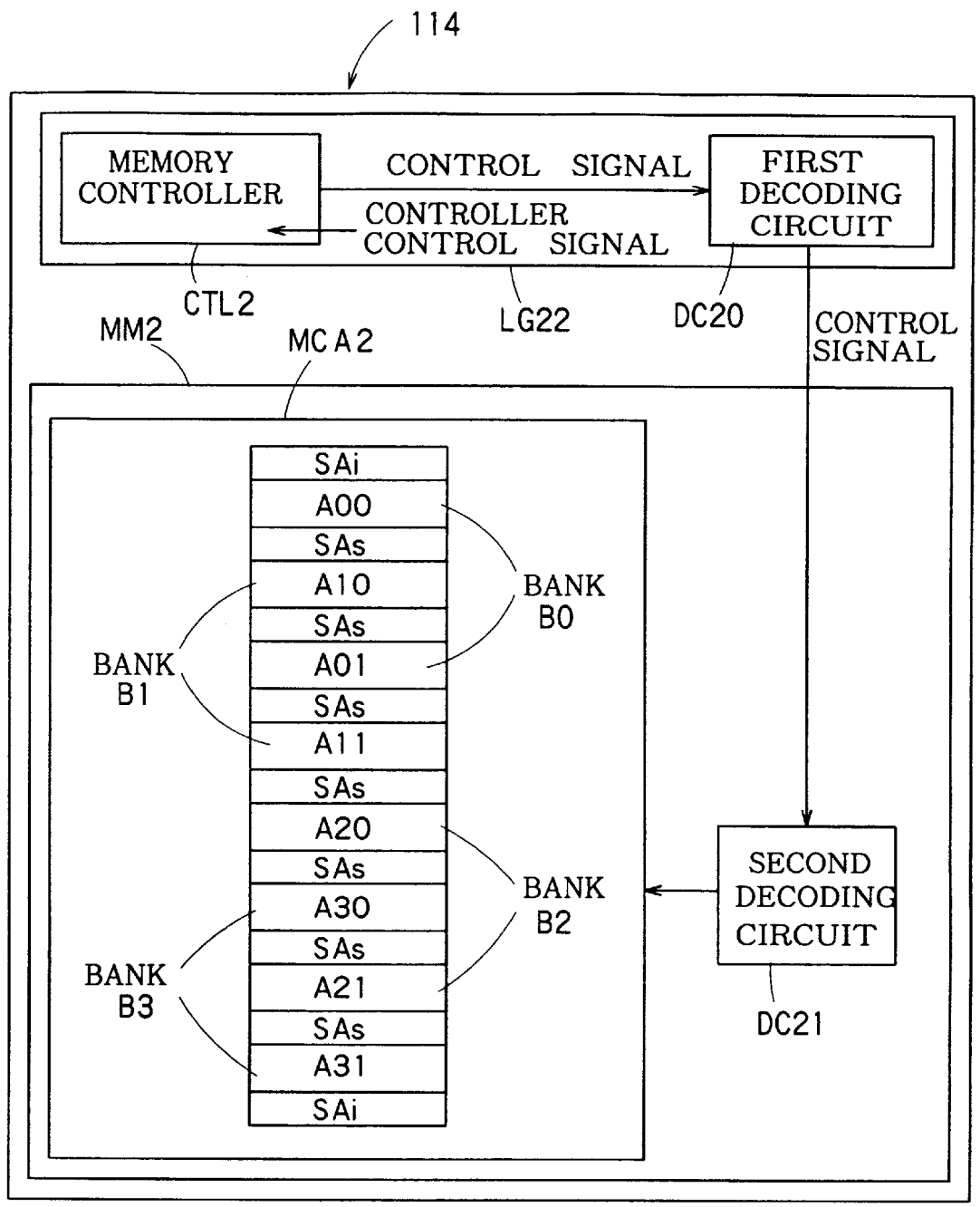
FIG. 18 is a diagram showing inside configuration of the semiconductor integrating circuit device in the ninth embodiment (when the memory controller and a first decoding circuit are formed inside the logic circuit)

FIG. 18 is a block diagram showing configuration of a semiconductor integrating circuit device 114 taken as still another modification. As shown in FIG. 18, the first decoding circuit DC20 may be provided in the logic circuit LG22. In this case, a control signal corresponding to the memory control signal is supplied from the memory controller CTL2 to the first decoding circuit DC20. Then, a control signal corresponding to the internal control signal from the first decoding circuit DC20 is supplied to the second decoding circuit DC21.

Figure 19:
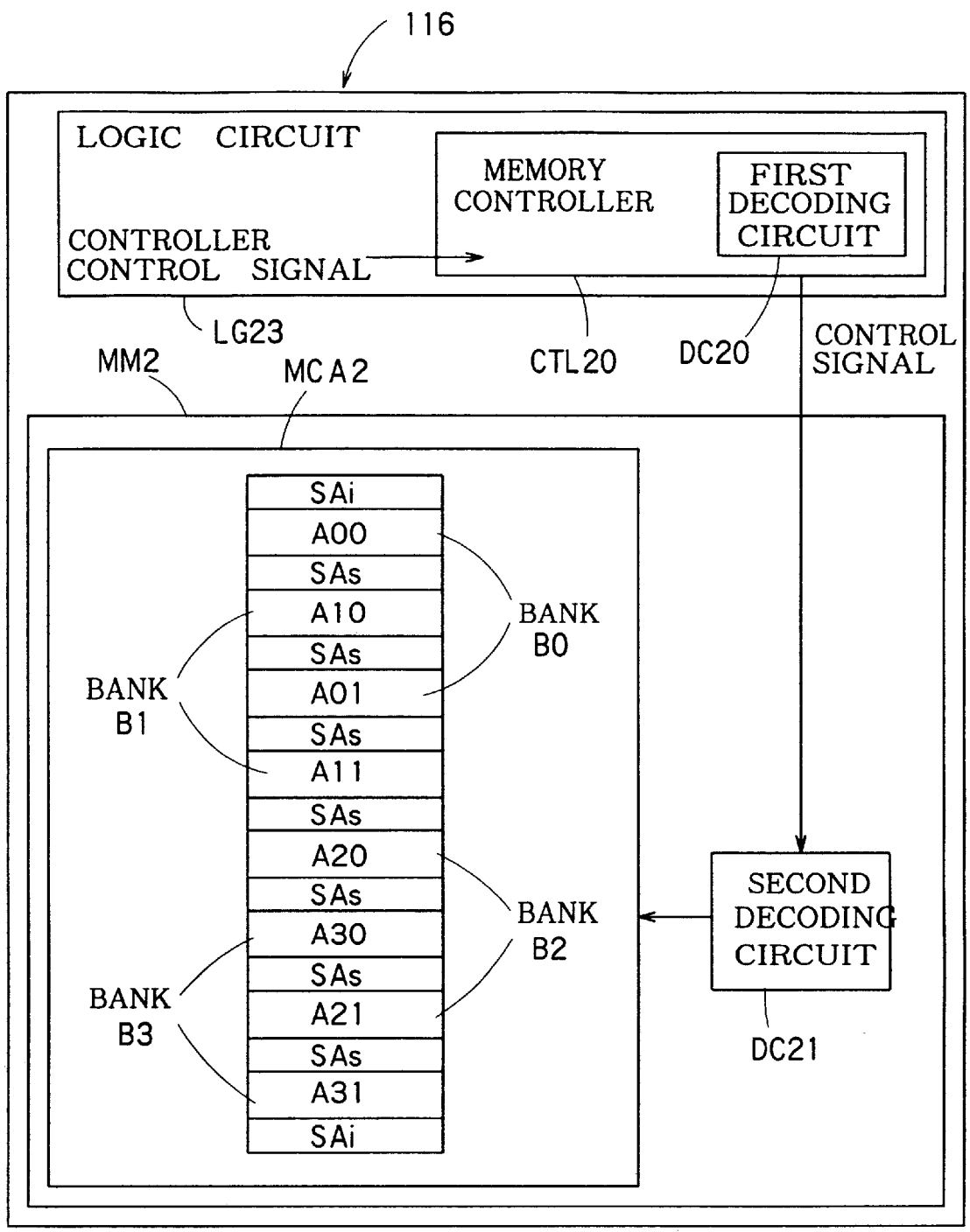
FIG. 19 is a diagram showing inside configuration of the semiconductor integrating circuit device in the ninth embodiment (when the memory controller is formed inside the logic circuit, and the first decoding circuit is provided inside the memory controller)

FIG. 19 is a block diagram showing configuration of a semiconductor integrated circuit device 116 as yet another modification. As shown in FIG. 19, the first decode circuit DC20 may be provided inside the memory controller CTL20. In this case, pursuant to an instruction from the memory controller CTL20, the first decoding circuit DC20 generates a control signal corresponding to the internal control signal, and supplies it to the second decoding circuit DC21.

Inside configuration of the second decoding circuit DC21 in FIGS. 16 through 19 is substantially the same as FIG. 6B shown with reference to the third embodiment.

As explained above, the invention is applicable also to a semiconductor integrated circuit device incorporating a DRAM and a logic circuit.

TENTH EMBODIMENT

The tenth embodiment of the invention is directed to a semiconductor integrating circuit device incorporating the dynamic random access memory device according to the fourth embodiment already explained together with a logic circuit.

Figure 20:
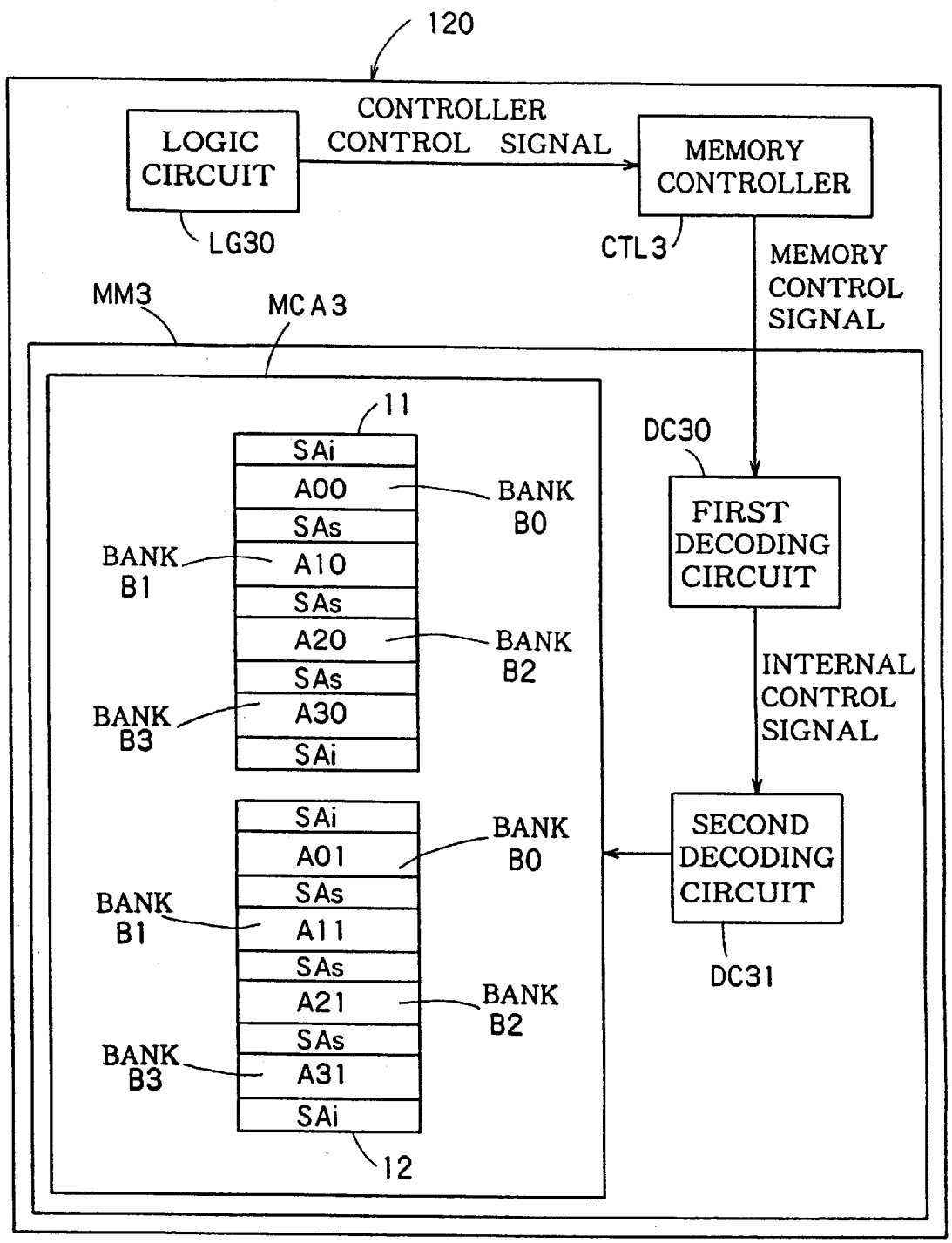
FIG. 20 is a diagram showing inside configuration of the semiconductor integrating circuit device in the tenth embodiment (when the logic circuit and the memory controller are formed separately)

FIG. 20 is a diagram showing configuration of a semiconductor integrated circuit device 120 according to the tenth embodiment. As shown in FIG. 20, the semiconductor integrated circuit device 120 according to the tenth embodiment is composed by adding a logic circuit LG30 to the dynamic random access memory device according to the fourth embodiment already explained. The logic circuit LG30 is a circuit for executing various logical operations. During such logical operations, if there occurs the need for writing data in a memory macro MM3 or reading data out of the memory macro MM3, the logic circuit LG30 issues a necessary request to the memory controller CTL3 as a controller control signal. Also when a request for writing data into the memory macro MM3 is input from outside to the logic circuit LG30, or a request for reading data is input from outside to the logic circuit LG30, the logic circuit LG30 sends a necessary request as the controller control signal to the memory controller CTL3.

The controller control signal may include an address in the memory macro MM3 in the original form, or in form of information designating the next address, for example, so that the memory controller CTL3 generates the address in the memory macro MM3 on the basis of the information.

Control of the cycle of refresh requests to the memory macro MM3 may be managed either by the logic circuit LG30 or by the memory controller CTL3. If the memory controller CTL3 manages refresh requests, a busy signal is transmitted from the memory controller CTL3 to the logic circuit LG30 in the refresh period.

Upon receipt of the controller control signal, the memory controller CTL3 generates a memory control signal based on the controller control signal, and supplies it to the first decoding circuit DC30 of the memory macro MM3. If the memory controller CTL3 manages refresh requests, it generates the memory control signal under its own control, and supplies it to the first decoding circuit DC30. Subsequent operations are substantially the same as the fourth embodiment.

Figure 21:
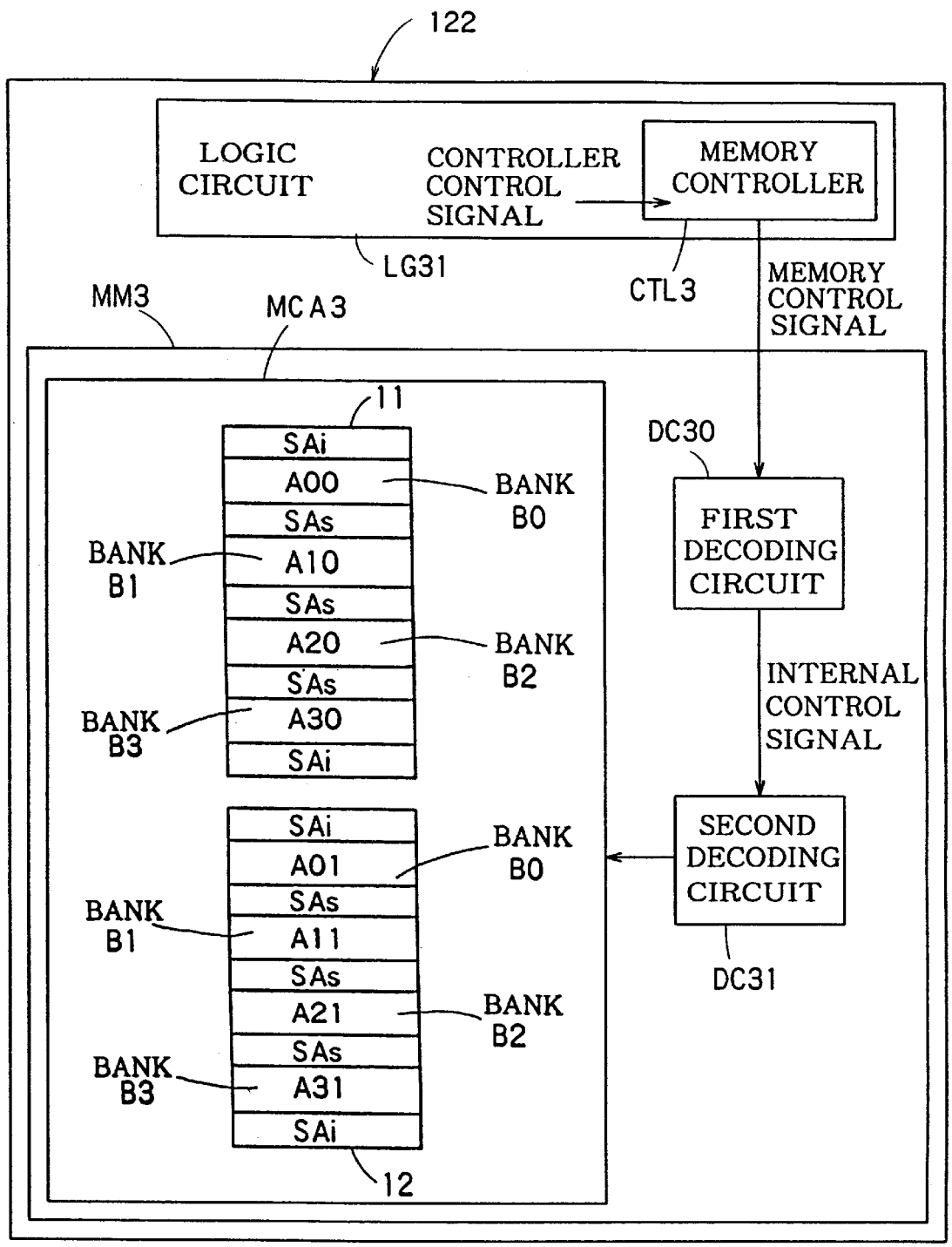
FIG. 21 is a diagram showing inside configuration of the semiconductor integrating circuit device in the tenth embodiment (when the memory controller is formed inside the logic circuit)

FIG. 21 is a diagram showing another version of the tenth embodiment of the invention. As shown in FIG. 21, the semiconductor integrated circuit device 122 includes the memory controller CTL3 inside the logic circuit LG31. The memory controller CTL3 operates as a part of the logic circuit LG31, and generates a memory control signal in response to the controller control signal received from a portion other than the memory controller CTL3 of the logic circuit LG31, or under its own control. This memory control signal is supplied from the memory controller CTL3 to the first decoding circuit DC30 of the memory macro MM3.

Figure 22:
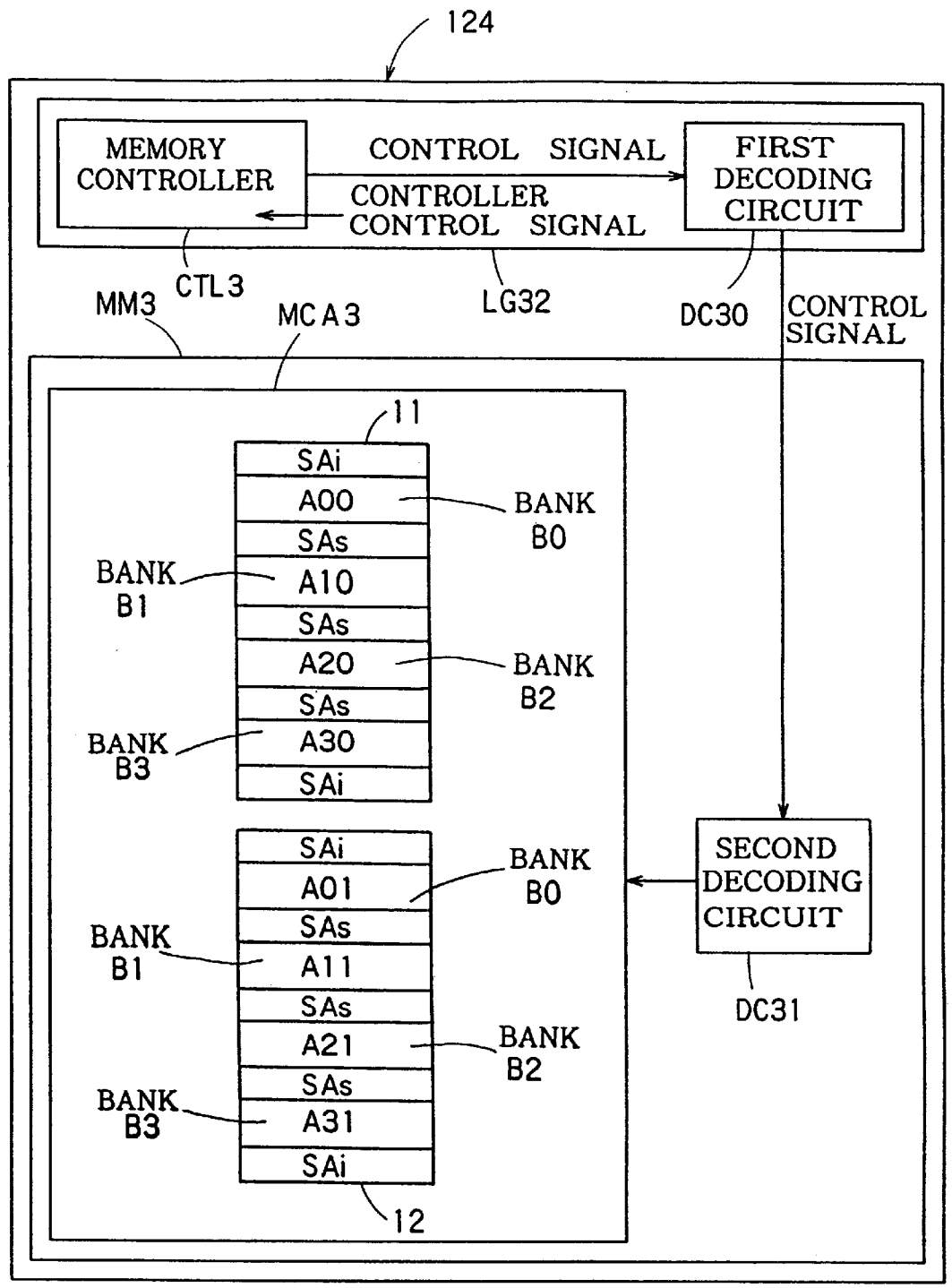
FIG. 22 is a diagram showing inside configuration of the semiconductor integrating circuit device in the tenth embodiment (when the memory controller and a first decoding circuit are formed inside the logic circuit)

FIG. 22 is a block diagram showing configuration of a semiconductor integrating circuit device 124 taken as still another modification. As shown in FIG. 22, the first decoding circuit DC30 may be provided in the logic circuit LG32. In this case, a control signal corresponding to the memory control signal is supplied from the memory controller CTL3 to the first decoding circuit DC30. Then, a control signal corresponding to the internal control signal from the first decoding circuit DC30 is supplied to the second decoding circuit DC31.

FIG. 23 is a block diagram showing configuration of a semiconductor integrated circuit device 126 as yet another modification. As shown in FIG. 23, the first decode circuit DC30 may be provided inside the memory controller CTL30. In this case, pursuant to an instruction from the memory controller CTL30, the first decoding circuit DC30 generates a control signal corresponding to the internal control signal, and supplies it to the second decoding circuit DC31.

Inside configuration of the second decoding circuit DC31 in FIGS. 20 through 23 is substantially the same as FIG. 7B shown with reference to the fourth embodiment. When the first decoding circuit DC30 and the second decoding circuit DC31 shown in FIGS. 20 through 23 are designed to have the same inside configuration as FIG. 9 already explained, the page length variable circuit can be used as the refresh control circuit.

As explained above, the invention is applicable also to a semiconductor integrated circuit device incorporating a DRAM and a logic circuit.

ELEVENTH EMBODIMENT

The eleventh embodiment of the invention is directed to a semiconductor integrating circuit device incorporating the dynamic random access memory device according to the fifth embodiment already explained together with a logic circuit.

Figure 24:
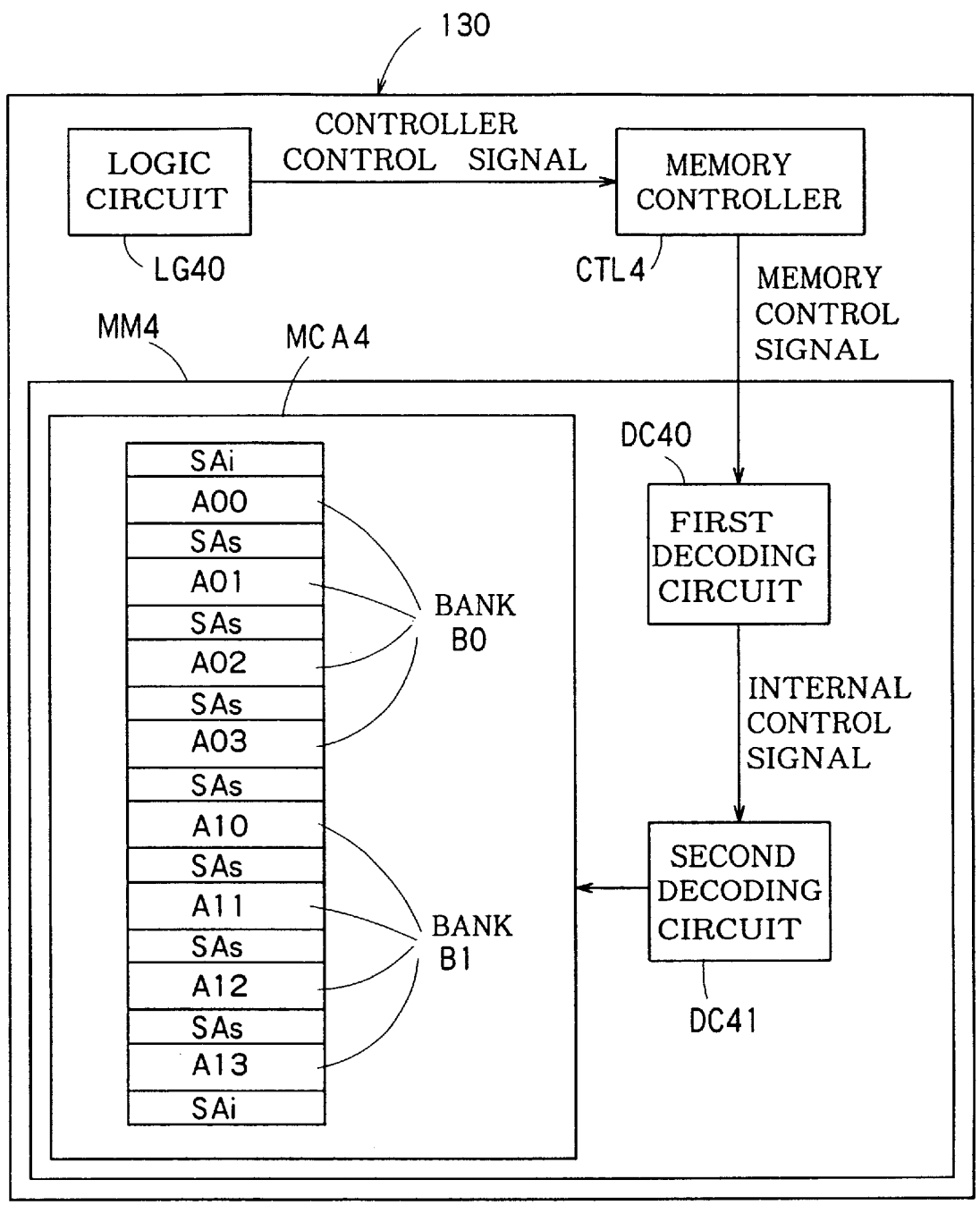
FIG. 24 is a diagram showing inside configuration of the semiconductor integrating circuit device in the eleventh embodiment (when the logic circuit and the memory controller are formed separately)

FIG. 24 is a diagram showing configuration of a semiconductor integrated circuit device 130 according to the eleventh embodiment. As shown in FIG. 24, the semiconductor integrated circuit device 130 according to the eleventh embodiment is composed by adding a logic circuit LG40 to the dynamic random access memory device according to the fifth embodiment already explained. The logic circuit LG40 is a circuit for executing various logical operations. During such logical operations, if there occurs the need for writing data in a memory macro MM4 or reading data out of the memory macro MM4, the logic circuit LG40 issues a necessary request to the memory controller CTL4 as a controller control signal. Also when a request for writing data into the memory macro MM4 is input from outside to the logic circuit LG40, or a request for reading data is input from outside to the logic circuit LG40, the logic circuit LG40 sends a necessary request as the controller control signal to the memory controller CTL4.

The controller control signal may include an address in the memory macro MM4 in the original form, or in form of information designating the next address, for example, so that the memory controller CTL4 generates the address in the memory macro MM4 on the basis of the information.

Control of the cycle of refresh requests to the memory macro MM4 may be managed either by the logic circuit LG40 or by the memory controller CTL4. If the memory controller CTL4 manages refresh requests, a busy signal is transmitted from the memory controller CTL4 to the logic circuit LG40 in the refresh period.

Upon receipt of the controller control signal, the memory controller CTL4 generates a memory control signal based on the controller control signal, and supplies it to the first decoding circuit DC40 of the memory macro MM4. If the memory controller CTL4 manages refresh requests, it generates the memory control signal under its own control, and supplies it to the first decoding circuit DC40. Subsequent operations are substantially the same as the fourth embodiment.

Figure 25:
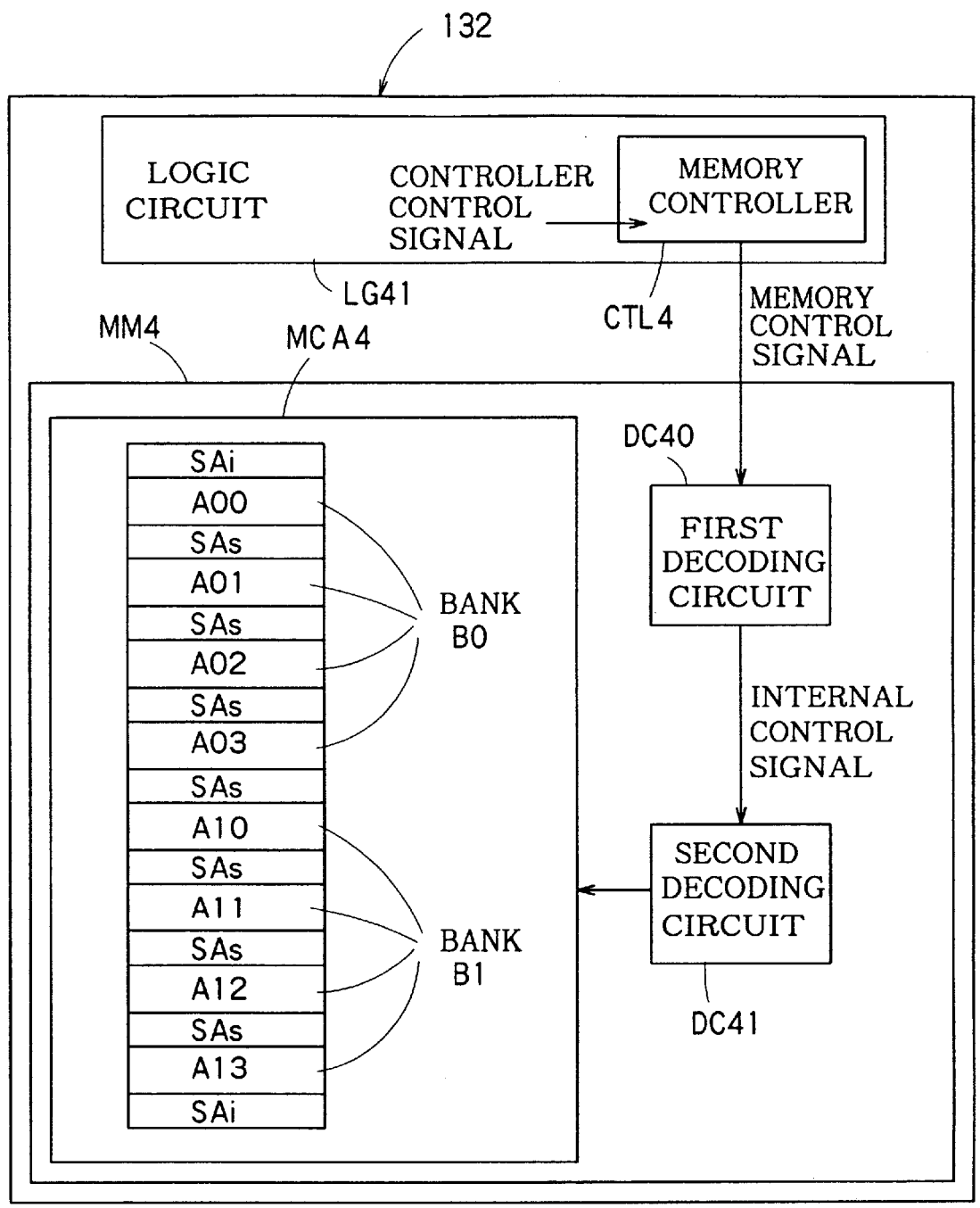
FIG. 25 is a diagram showing inside configuration of the semiconductor integrating circuit device in the eleventh embodiment (when the memory controller is formed inside the logic circuit)

FIG. 25 is a diagram showing another version of the eleventh embodiment of the invention. As shown in FIG. 25, the semiconductor integrated circuit device 132 includes the memory controller CTL4 inside the logic circuit LG41. The memory controller CTL4 operates as a part of the logic circuit LG41, and generates a memory control signal in response to the controller control signal received from a portion other than the memory controller CTL4 of the logic circuit LG41, or under its own control. This memory control signal is supplied from the memory controller CTL4 to the first decoding circuit DC40 of the memory macro MM4.

Figure 26:
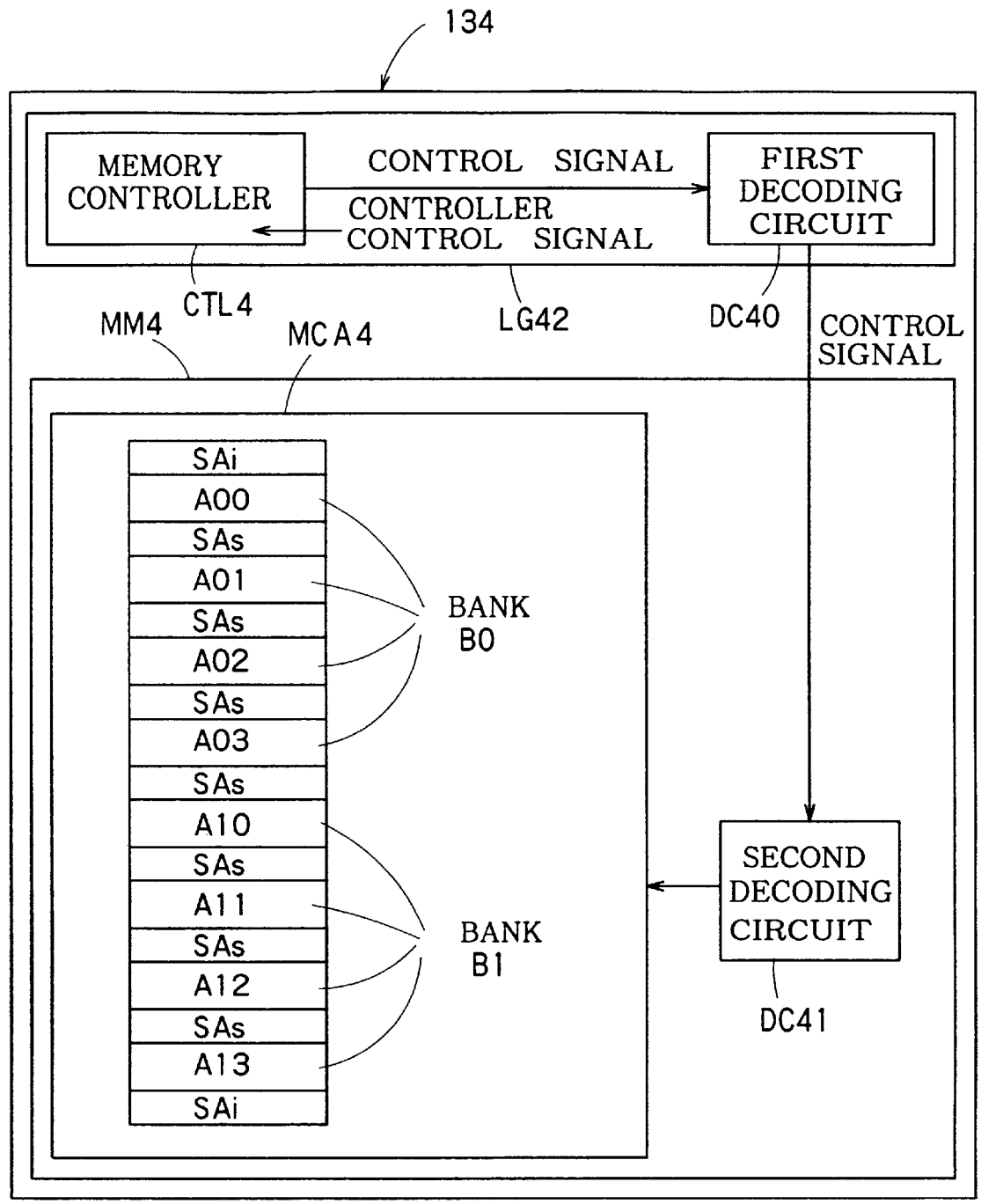
FIG. 26 is a diagram showing inside configuration of the semiconductor integrating circuit device in the eleventh embodiment (when the memory controller and a first decoding circuit are formed inside the logic circuit)

FIG. 26 is a block diagram showing configuration of a semiconductor integrating circuit device 134 taken as still another modification. As shown in FIG. 26, the first decoding circuit DC40 may be provided in the logic circuit LG42. In this case, a control signal corresponding to the memory control signal is supplied from the memory controller CTL4 to the first decoding circuit DC40. Then, a control signal corresponding to the internal control signal from the first decoding circuit DC40 is supplied to the second decoding circuit DC41.

FIG. 27 is a block diagram showing configuration of a semiconductor integrated circuit device 136 as yet another modification. As shown in FIG. 27, the first decode circuit DC40 may be provided inside the memory controller CTL40. In this case, pursuant to an instruction from the memory controller CTL40, the first decoding circuit DC40 generates a control signal corresponding to the internal control signal, and supplies it to the second decoding circuit DC41.

Inside configuration of the second decoding circuit DC41 in FIGS. 24 through 27 is substantially the same as FIG. 8B shown with reference to the fifth embodiment.

As explained above, the invention is applicable also to a semiconductor integrated circuit device incorporating a DRAM and a logic circuit.

TWELFTH EMBODIMENT

The twelfth embodiment of the invention is directed to a semiconductor integrating circuit device incorporating the dynamic random access memory device according to the seventh embodiment already explained together with a logic circuit.

Figure 28:
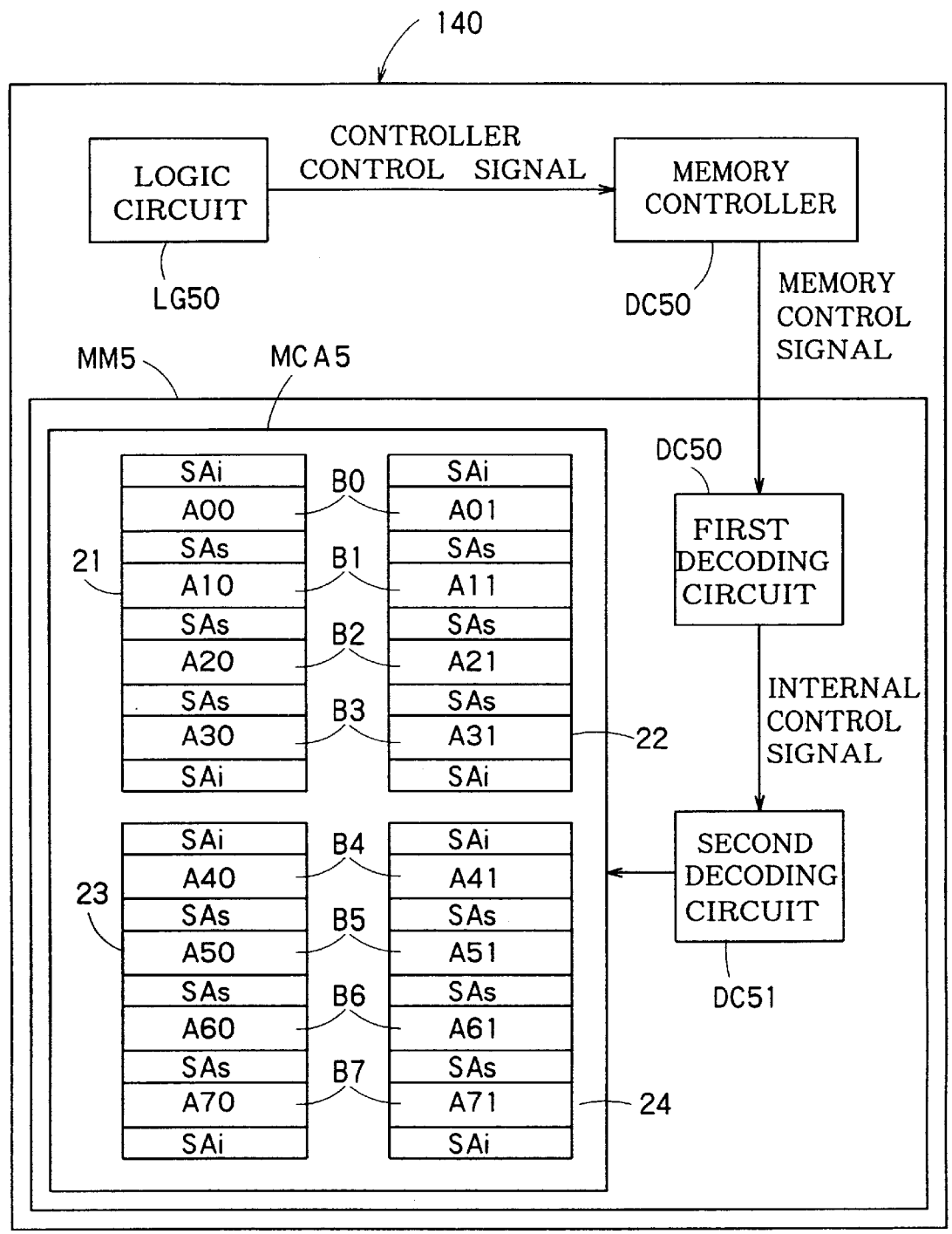
FIG. 28 is a diagram showing inside configuration of the semiconductor integrating circuit device in the twelfth embodiment (when the logic circuit and the memory controller are formed separately)

FIG. 28 is a diagram showing configuration of a semiconductor integrated circuit device 140 according to the twelfth embodiment. As shown in FIG. 28, the semiconductor integrated circuit device 140 according to the twelfth embodiment is composed by adding a logic circuit LG50 to the dynamic random access memory device according to the seventh embodiment already explained. The logic circuit LG50 is a circuit for executing various logical operations. During such logical operations, if there occurs the need for writing data in a memory macro MM5 or reading data out of the memory macro MM5, the logic circuit LG50 issues a necessary request to the memory controller CTL5 as a controller control signal. Also when a request for writing data into the memory macro MM5 is input from outside to the logic circuit LG50, or a request for reading data is input from outside to the logic circuit LG50, the logic circuit LG50 sends a necessary request as the controller control signal to the memory controller CTL5.

The controller control signal may include an address in the memory macro MM5 in the original form, or in form of information designating the next address, for example, so that the memory controller CTL5 generates the address in the memory macro MM5 on the basis of the information.

Control of the cycle of refresh requests to the memory macro MM5 may be managed either by the logic circuit LG50 or by the memory controller CTL5. If the memory controller CTL5 manages refresh requests, a busy signal is transmitted from the memory controller CTL5 to the logic circuit LG50 in the refresh period.

Upon receipt of the controller control signal, the memory controller CTL5 generates a memory control signal based on the controller control signal, and supplies it to the first decoding circuit DC50 of the memory macro MM5. If the memory controller CTL5 manages refresh requests, it generates the memory control signal under its own control, and supplies it to the first decoding circuit DC50. Subsequent operations are substantially the same as the fourth embodiment.

Figure 29:
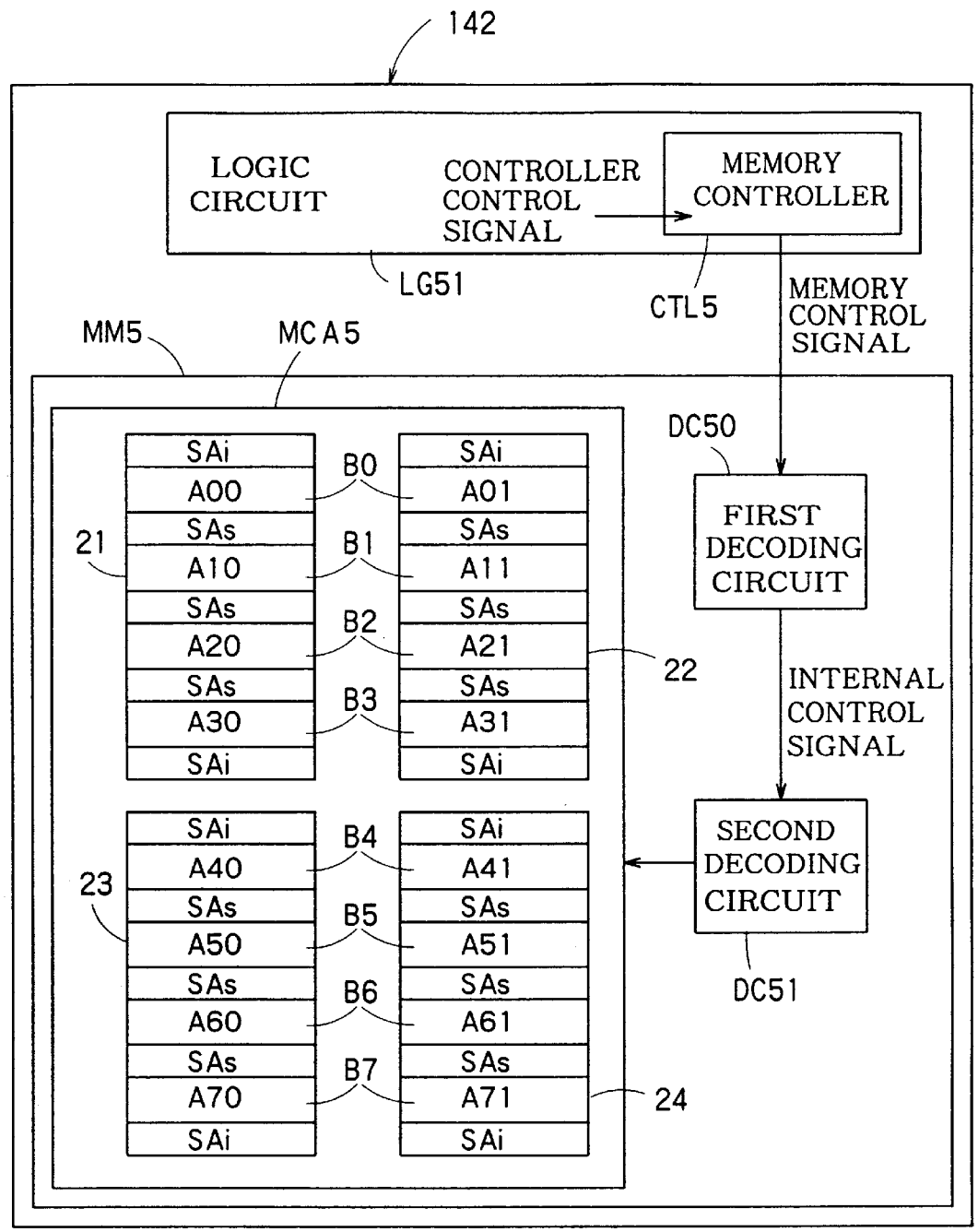
FIG. 29 is a diagram showing inside configuration of the semiconductor integrating circuit device in the twelfth embodiment (when the memory controller is formed inside the logic circuit)

FIG. 29 is a diagram showing another version of the twelfth embodiment of the invention. As shown in FIG. 29, the semiconductor integrated circuit device 142 includes the memory controller CTL5 inside the logic circuit LG51. The memory controller CTL5 operates as a part of the logic circuit LG51, and generates a memory control signal in response to the controller control signal received from a portion other than the memory controller CTL5 of the logic circuit LG51, or under its own control. This memory control signal is supplied from the memory controller CTL5 to the first decoding circuit DC50 of the memory macro MM5.

Figure 30:
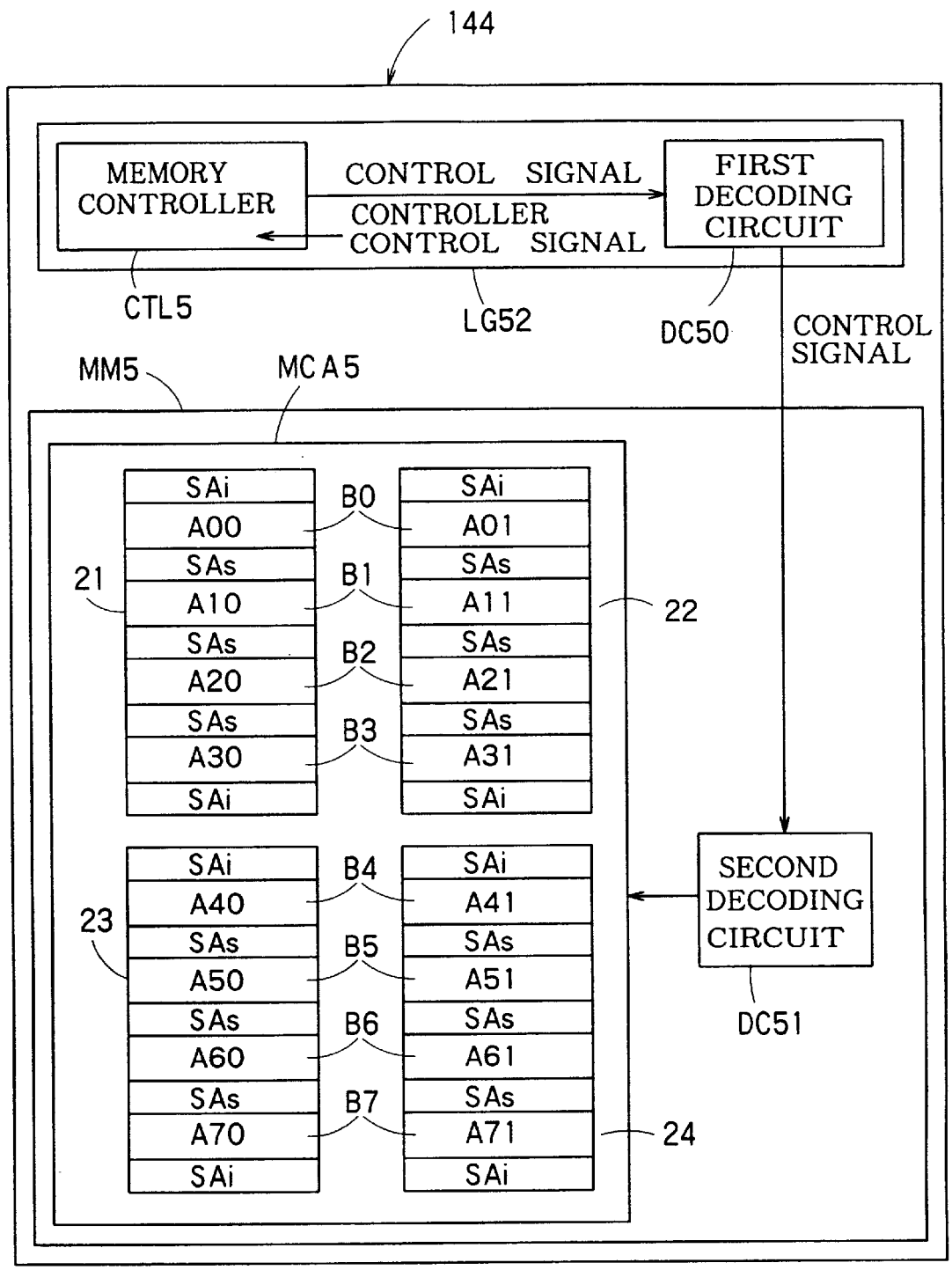
FIG. 30 is a diagram showing inside configuration of the semiconductor integrating circuit device in the twelfth embodiment (when the memory controller and a first decoding circuit are formed inside the logic circuit)

FIG. 30 is a block diagram showing configuration of a semiconductor integrating circuit device 144 taken as still another modification. As shown in FIG. 30, the first decoding circuit DC50 may be provided in the logic circuit LG52. In this case, a control signal corresponding to the memory control signal is supplied from the memory controller CTL5 to the first decoding circuit DC50. Then, a control signal corresponding to the internal control signal from the first decoding circuit DC50 is supplied to the second decoding circuit DC51.

FIG. 31 is a block diagram showing configuration of a semiconductor integrated circuit device 146 as yet another modification. As shown in FIG. 31, the first decode circuit DC50 may be provided inside the memory controller CTL50. In this case, pursuant to an instruction from the memory controller CTL50, the first decoding circuit DC50 generates a control signal corresponding to the internal control signal, and supplies it to the second decoding circuit DC51.

Inside configuration of the second decoding circuit DC51 in FIGS. 28 through 31 is substantially the same as FIG. 11 shown with reference to the seventh embodiment.

As explained above, the invention is applicable also to a semiconductor integrated circuit device incorporating a DRAM and a logic circuit.

As described above, according to the invention, by simultaneously activating more sub-arrays in one bank in the refresh mode, the load to the memory controller can be alleviated, and the performance of the DRAM system is improved. Additionally, since the number of banks activated simultaneously can be reduced, it is possible to minimize the occurrence of operation constraints peculiar to non-independent bank configurations employing the shared sense-amplifier system. As a result, without the need for superfluous precharge period, high-speed operation is ensured.

What is claimed is:

1. A dynamic random access memory device comprising:
   a memory cell array including a plurality of banks each composed of a plurality of sub-arrays, and sense amplifier circuit shared by sub-arrays in different banks; and
   a control circuit having a row access mode for activating one or more sub-arrays in each said bank selected for reading or writing data, and a refresh mode for activating a plurality of sub-arrays in each said bank at substantially the same timing to refresh memory cell data therein, said sub-arrays in one bank activated at substantially the same timing in said refresh mode being more than said sub-arrays activated in one bank in said row access mode.

2. The dynamic random access memory device according to claim 1 wherein said sub-arrays make up a plurality of blocks, each said block includes one each of said sub-arrays in different banks, and said sub-arrays are arranged in each said block so that every adjacent ones of said sub-arrays share each said sense amplifier circuit.

3. The dynamic random access memory device according to claim 2 wherein each said block includes all banks in said memory cell array.

4. The dynamic random access memory device according to claim 2 wherein each said block includes a part of said banks in said memory cell array.

5. The dynamic random access memory device according to claim 2 wherein in each said bank, said sub-arrays do not share any sense amplifier circuit there among, and all sub-arrays in one bank are activated in the refresh mode at substantially the same timing.

6. The dynamic random access memory device according to claim 5 wherein said control circuit includes:
   a first decoder introducing a first address signal and a refresh control signal, and outputting a first internal signal which is responsive to said first address signal in said row access mode to select at least one sub-array from said plurality of banks, and responsive to said refresh control signal in said refresh mode to select all sub-arrays in said plurality of banks; and
   a second decoder introducing a second address signal and said first internal signal, and outputting a second internal signal which is responsive to said second address signal and said first internal signal in said row access mode to select at least one sub-array, and responsive to said second address signal and said first internal signal in said refresh mode to select all sub-arrays in one bank.

7. The dynamic random access memory device according to claim 6 wherein said first address signal, said second address signal and refresh control signal are generated on the basis of a signal outputted from a memory controller.

8. The dynamic random access memory device according to claim 6 wherein said control circuit includes a page-length variable signal line for activating said sub-arrays in one bank at substantially the same timing in said row access mode, and said page-length variable signal line is used as a refresh control line for transferring said refresh control signal in said refresh mode.

9. The dynamic random access memory device according to claim 1 wherein said sub-arrays make up at least one block in which said sub-arrays are arranged so that every adjacent ones of said sub-arrays share each said sense amplifier circuit, but sub-arrays belonging to a common bank do not share any sense amplifier circuit there among.

10. The dynamic random access memory device according to claim 9 wherein in the order of arrangement of said sub-arrays, every other sub-arrays are designated as one bank.

11. The dynamic random access memory device according to claim 9 wherein said sub-arrays do not share any sense amplifier circuit within each bank, and in the refresh mode, all said sub-arrays in one bank are activated at substantially the same timing.

12. The dynamic random access memory device according to claim 11 wherein said control circuit includes:
    a first decoder introducing a first address signal and a refresh control signal, and outputting a first internal signal which is responsive to said first address signal in said row access mode to select at least one sub-array from said plurality of banks, and responsive to said refresh control signal in said refresh mode to select all sub-arrays in said plurality of banks; and
    a second decoder introducing a second address signal and said first internal signal, and outputting a second internal signal which is responsive to said second address signal and said first internal signal in said row access mode to select at least one sub-array, and responsive to said second address signal and said first internal signal in said refresh mode to select all sub-arrays in one bank.

13. The dynamic random access memory device according to claim 12 wherein in the order of arrangement of said sub-arrays, addresses are established so that one end of the arrangement corresponds to the least significant address in said second address signal, and the other end of the arrangement corresponds to the most significant address in said second address signal.

14. The dynamic random access memory device according to claim 12 wherein said first address signal, said second address signal and said refresh control signal are generated on the basis of a signal outputted from a memory controller.

15. A dynamic random access memory device comprising:
    a memory cell array including a plurality of banks each composed of a plurality of sub-arrays, and sense amplifier circuit shared among said banks, said sub-arrays in a common bank being arranged sequentially to share said sense amplifier circuits; and
    a control circuit having a row access mode for activating one or more sub-arrays in each said bank selected for reading or writing data, and a refresh mode for activating a plurality of sub-arrays in each said bank at substantially the same timing to refresh memory cell data therein, said sub-arrays in one bank activated at substantially the same timing in said refresh mode being more than said sub-arrays activated in one bank in said row access mode.

16. The dynamic random access memory device according to claim 15 wherein said control circuit activates said sub-arrays which belong to one bank and do not share any sense amplifier there among at substantially the same timing in said refresh mode.

17. The dynamic random access memory device according to claim 15 wherein said memory cell array is divided, for each said bank, into a first group composed of a plurality of sub-arrays sharing no sense amplifier within one bank, and a second group composed of a plurality of sub-arrays different from those in said first group sharing no sense amplifier circuit within one bank, said control circuit activating sub-arrays in said first group or said second group within one bank at substantially the same timing in said refresh mode.

18. The dynamic random access memory device according to claim 17 wherein said control circuit includes:

a first decoder introducing a first address signal and a refresh control signal, and outputting a first internal signal which is responsive to said first address signal in said row access mode to select at least one sub-array from said plurality of banks, and responsive to said first address signal and said refresh control signal in said refresh mode to select sub-arrays of said first group or said second group in said plurality of banks; and a second decoder introducing a second address signal and said first internal signal, and outputting a second internal signal which is responsive to said second address signal in said row access mode to select at least one sub-array, and responsive to said second address signal and said first internal signal in said refresh mode to select sub-arrays of said first group or said second group in one bank.

19. The dynamic random access memory device according to claim 18 wherein said first address signal, said second address signal and said refresh control signal are generated on the basis of a signal outputted from a memory controller.

20. A semiconductor integrated circuit device comprising:

a memory cell array including a plurality of banks each composed of a plurality of sub-arrays, and sense amplifier circuit shared by sub-arrays in different banks;

a control circuit having a row access mode for activating one or more sub-arrays in each said bank selected for reading or writing data, and a refresh mode for activating a plurality of sub-arrays in each said bank at substantially the same timing to refresh memory cell data therein, said sub-arrays in one bank activated at substantially the same timing in said refresh mode being more than said sub-arrays activated in one bank in said row access mode; and a logical operation circuit for executing various logical operations, which is activated upon the need for reading data from said memory cell array or writing data in said memory cell array to read out data from said memory cell array or write data in said memory cell array through said control circuit.

21. The semiconductor integrated circuit device according to claim 20 wherein said sub-arrays make up a plurality of blocks, each said block includes one each of said sub-arrays in different banks, and said sub-arrays are arranged in each said block so that every adjacent ones of said sub-arrays share each said sense amplifier circuit.

22. The semiconductor integrated circuit device according to claim 21 wherein each said block includes all banks in said memory cell array.

23. The semiconductor integrated circuit device according to claim 21 wherein each said block includes a part of said banks in said memory cell array.

24. The semiconductor integrated circuit device according to claim 21 wherein in each said bank, said sub-arrays do not share any sense amplifier circuit thereamong, and all sub-arrays in one bank are activated in the refresh mode at substantially the same timing.

25. The semiconductor integrated circuit device according to claim 24 wherein said control circuit includes:

a first decoder introducing a first address signal and a refresh control signal, and outputting a first internal signal which is responsive to said first address signal in said row access mode to select at least one sub-array from said plurality of banks, and responsive to said refresh control signal in said refresh mode to select all sub-arrays in said plurality of banks; and a second decoder introducing a second address signal and said first internal signal, and outputting a second internal signal which is responsive to said second address signal and said first internal signal in said row access mode to select at least one sub-array, and responsive to said second address signal and said first internal signal in said refresh mode to select all sub-arrays in one bank.

26. The semiconductor integrated circuit device according to claim 25 further comprising a memory controller for outputting a memory control signal on the basis of a controller control signal from said logical operation circuit or under control of its own, said control circuit further including a control signal generating circuit which introduces said memory control signal, and in response to the memory control signal, outputs said first address signal, said second address signal and said refresh control signal, said memory cell array and said control circuit constituting a memory macro.

27. The semiconductor integrated circuit device according to claim 25 further comprising a memory controller for outputting a memory control signal on the basis of a controller control signal from said logical operation circuit or under control of its own, said control circuit further including a control signal generating circuit which introduces said memory control signal, and in response to the memory control signal, outputs said first address signal, said second address signal and said refresh control signal, said logical operation circuit and said memory controller constituting a logic circuit, and said memory cell array and said control circuit constituting a memory macro.

28. The semiconductor integrated circuit device according to claim 25 further comprising a memory controller for outputting a memory control signal on the basis of a controller control signal from said logical operation circuit or under the own control, said control circuit further including a control signal generating circuit which introduces said memory control signal, and in response to the memory control signal, outputs said first address signal, said second address signal and said refresh control signal, said logical operation circuit, said memory controller and said control signal generating circuit constituting a logic circuit, and said memory cell array, said first decoder and said second decoder constituting a memory macro.

29. The semiconductor integrated circuit device according to claim 25 further comprising a memory controller for outputting a memory control signal on the basis of a controller control signal from said logical operation circuit or under the own control, said control circuit further including a control signal generating circuit which introduces said memory control signal, and in response to the memory control signal, outputs said first address signal, said second address signal and said refresh control signal, said logical operation circuit, said memory controller and said control signal generating circuit constituting a logic circuit, and said control signal generating circuit being provided inside said memory controller, and said memory cell array, said first decoder and said second decoder constituting a memory macro.

30. The semiconductor integrated circuit device according to claim 25 wherein said control circuit includes a page-length variable signal line for activating a plurality of sub-arrays in one bank at substantially the same timing in said row access mode, and said page-length variable signal line is used as a refresh control line for transferring said refresh control signal in said refresh mode.

31. The semiconductor integrated circuit device according to claim 20 wherein said sub-arrays make up at least one block in which said sub-arrays are arranged so that every adjacent ones of said sub-arrays share each said sense amplifier circuit, but sub-arrays belonging to a common bank do not share any sense amplifier circuit thereamong.

32. The semiconductor integrated circuit device according to claim 31 wherein in the order of arrangement of said sub-arrays, every other sub-arrays are designated as one bank.

33. The semiconductor integrated circuit device according to claim 31 wherein said sub-arrays do not share any sense amplifier circuit within each bank, and in the refresh mode, all said sub-arrays in one bank are activated at substantially the same timing.

34. The semiconductor integrated circuit device according to claim 33 wherein said control circuit includes:
 a first decoder introducing a first address signal and a refresh control signal, and outputting a first internal signal which is responsive to said first address signal in said row access mode to select at least one sub-array from said plurality of banks, and responsive to said refresh control signal in said refresh mode to select all sub-arrays in said plurality of banks; and
 a second decoder introducing a second address signal and said first internal signal, and outputting a second internal signal which is responsive to said second address signal and said first internal signal in said row access mode to select at least one sub-array, and responsive to said second address signal and said first internal signal in said refresh mode to select all sub-arrays in one bank.

35. The semiconductor integrated circuit device according to claim 34 further comprising a memory controller for outputting a memory control signal on the basis of a controller control signal from said logical operation circuit or under control of its own,
 said control circuit further including a control signal generating circuit which introduces said memory control signal, and in response to the memory control signal, outputs said first address signal, said second address signal and said refresh control signal,
 said memory cell array and said control circuit constituting a memory macro.

36. The semiconductor integrated circuit device according to claim 34 further comprising a memory controller for outputting a memory control signal on the basis of a controller control signal from said logical operation circuit or under control of its own,
 said control circuit further including a control signal generating circuit which introduces said memory control signal, and in response to the memory control signal, outputs said first address signal, said second address signal and said refresh control signal,
 said logical operation circuit and said memory controller constituting a logic circuit, and said memory cell array and said control circuit constituting a memory macro.

37. The semiconductor integrated circuit device according to claim 34 further comprising a memory controller for outputting a memory control signal on the basis of a controller control signal from said logical operation circuit or under the own control,
 said control circuit further including a control signal generating circuit which introduces said memory control signal, and in response to the memory control signal, outputs said first address signal, said second address signal and said refresh control signal,
 said logical operation circuit, said memory controller and said control signal generating circuit constituting a logic circuit, and said memory cell array, said first decoder and said second decoder constituting a memory macro.

38. The semiconductor integrated circuit device according to claim 34 further comprising a memory controller for outputting a memory control signal on the basis of a controller control signal from said logical operation circuit or under the own control,
 said control circuit further including a control signal generating circuit which introduces said memory control signal, and in response to the memory control signal, outputs said first address signal, said second address signal and said refresh control signal,
 said logical operation circuit, said memory controller and said control signal generating circuit constituting a logic circuit, and said control signal generating circuit being provided inside said memory controller, and said memory cell array, said first decoder and said second decoder constituting a memory macro.

39. The semiconductor integrated circuit device according to claim 34 wherein in the order of arrangement of said sub-arrays, addresses are established so that one end of the arrangement corresponds to the least significant address in said second address signal, and the other end of the arrangement corresponds to the most significant address in said second address signal.

40. A semiconductor integrated circuit device comprising:
 a memory cell array including a plurality of banks each composed of a plurality of sub-arrays, and sense amplifier circuit shared among said banks, said sub-arrays in a common bank being arranged sequentially to share said sense amplifier circuits;
 a control circuit having a row access mode for activating one or more sub-arrays in each said bank selected for reading or writing data, and a refresh mode for activating a plurality of sub-arrays in each said bank at substantially the same timing to refresh memory cell data therein, said sub-arrays in one bank activated at substantially the same timing in said refresh mode being more than said sub-arrays activated in one bank in said row access mode; and
 a logical operation circuit for executing various logical operations, which is activated upon the need for reading data from said memory cell array or writing data in said memory cell array to read out data from said memory cell array or write data in said memory cell array through said control circuit.

41. The semiconductor integrated circuit device according to claim 40 wherein said control circuit activates said sub-arrays which belong to one bank and do not share any sense amplifier thereamong at substantially the same timing in said refresh mode.

42. The semiconductor integrated circuit device according to claim 40 wherein said memory cell array is divided, for each said bank, into a first group composed of a plurality of sub-arrays sharing no sense amplifier within one bank, and a second group composed of a plurality of sub-arrays different from those in said first group sharing no sense amplifier circuit within one bank, said control circuit activating sub-arrays in said first group or said second group within one bank at substantially the same timing in said refresh mode.

43. The semiconductor integrated circuit device according to claim 42 wherein said control circuit includes:

a first decoder introducing a first address signal and a refresh control signal, and outputting a first internal signal which is responsive to said first address signal in said row access mode to select at least one sub-array from said plurality of banks, and responsive to said first address signal and said refresh control signal in said refresh mode to select sub-arrays of said first group or said second group in said plurality of banks; and a second decoder introducing a second address signal and said first internal signal, and outputting a second internal signal which is responsive to said second address signal and said first internal signal in said row access mode to select at least one sub-array, and responsive to said second address signal and said first internal signal in said refresh mode to select sub-arrays of said first group or said second group in one bank.

44. The semiconductor integrated circuit device according to claim 43 further comprising a memory controller for outputting a memory control signal on the basis of a controller control signal from said logical operation circuit or under control of its own, said control circuit further including a control signal generating circuit which introduces said memory control signal, and in response to the memory control signal, outputs said first address signal, said second address signal and said refresh control signal, said memory cell array and said control circuit constituting a memory macro.

45. The semiconductor integrated circuit device according to claim 43 further comprising a memory controller for outputting a memory control signal on the basis of a controller control signal from said logical operation circuit or under control of its own, said control circuit further including a control signal generating circuit which introduces said memory control signal, and in response to the memory control signal, outputs said first address signal, said second address signal and said refresh control signal, said logical operation circuit and said memory controller constituting a logic circuit, and said memory cell array and said control circuit constituting a memory macro.

46. The semiconductor integrated circuit device according to claim 43 further comprising a memory controller for outputting a memory control signal on the basis of a controller control signal from said logical operation circuit or under the own control, said control circuit further including a control signal generating circuit which introduces said memory control signal, and in response to the memory control signal, outputs said first address signal, said second address signal and said refresh control signal, said logical operation circuit, said memory controller and said control signal generating circuit constituting a logic circuit, and said memory cell array, said first decoder and said second decoder constituting a memory macro.

47. The semiconductor integrated circuit device according to claim 43 further comprising a memory controller for outputting a memory control signal on the basis of a controller control signal from said logical operation circuit or under the own control, said control circuit further including a control signal generating circuit which introduces said memory control signal, and in response to the memory control signal, outputs said first address signal, said second address signal and said refresh control signal, said logical operation circuit, said memory controller and said control signal generating circuit constituting a logic circuit, and said control signal generating circuit being provided inside said memory controller, and said memory cell array, said first decoder and said second decoder constituting a memory macro.

* * * * *